(12) United States Patent
Lee et al.

(10) Patent No.: US 10,879,316 B2
(45) Date of Patent: Dec. 29, 2020

(54) ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Minsu Lee, Yongin-si (KR); Yong Sung Park, Seoul (KR); Won Jang Ki, Yongin-si (KR); Dae Hyun Noh, Hwaseong-si (KR); Seung Bin Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/547,536

(22) Filed: Aug. 21, 2019

(65) Prior Publication Data
US 2020/0235172 A1    Jul. 23, 2020

(30) Foreign Application Priority Data
Jan. 21, 2019  (KR) .................. 10-2019-0007770

(51) Int. Cl.
  *H01L 27/32*    (2006.01)
  *H01L 51/50*    (2006.01)
  *G06F 3/044*    (2006.01)

(52) U.S. Cl.
  CPC ........ *H01L 27/3216* (2013.01); *G06F 3/0443* (2019.05); *H01L 27/323* (2013.01); *H01L 27/326* (2013.01); *H01L 27/3246* (2013.01); *H01L 51/5056* (2013.01); *H01L 51/5088* (2013.01)

(58) Field of Classification Search
None
See application file for complete search history.

(56) References Cited

U.S. PATENT DOCUMENTS

| 9,508,778 B2 | 11/2016 | Kim et al. |
| 10,084,019 B2 | 9/2018 | Shim et al. |
| 2014/0252321 A1* | 9/2014 | Pyon .................. H01L 27/3246 257/40 |

(Continued)

FOREIGN PATENT DOCUMENTS

| EP | 2940752 | 11/2015 |
| KR | 10-2016-0056705 | 5/2016 |

(Continued)

*Primary Examiner* — Aneeta Yodichkas
(74) *Attorney, Agent, or Firm* — H.C. Park & Associates, PLC

(57) ABSTRACT

A display device including a substrate which has a plurality of pixels each including an emission portion and a non-emission portion, a first electrode which is disposed on the emission portion, a pixel definition layer which is disposed on an edge of the first electrode and the non-emission portion, a common organic layer which is disposed on the first electrode and the pixel definition layer, an organic light-emitting layer which is disposed on the common organic layer and overlaps the emission portion, and a second electrode which is disposed on the common organic layer and the organic light-emitting layer. The pixel definition layer includes a plurality of pits between adjacent pixels. The common organic layer and the second electrode are separated by the pits.

20 Claims, 29 Drawing Sheets

(56) References Cited

U.S. PATENT DOCUMENTS

| | | | |
|---|---|---|---|
| 2015/0162391 A1* | 6/2015 | Kim | H01L 27/3246 |
| | | | 257/40 |
| 2018/0053810 A1* | 2/2018 | Jin | H01L 51/525 |
| 2018/0069065 A1* | 3/2018 | Chen | H01L 29/4908 |
| 2018/0190738 A1 | 7/2018 | Park et al. | |
| 2018/0269267 A1 | 9/2018 | Ohchi | |

FOREIGN PATENT DOCUMENTS

| | | |
|---|---|---|
| KR | 10-2018-0025053 | 3/2018 |
| KR | 10-2018-0056646 | 5/2018 |
| KR | 10-2018-0079037 | 7/2018 |

* cited by examiner

ORGANIC LIGHT-EMITTING DISPLAY DEVICE AND METHOD OF MANUFACTURING THE SAME

CROSS REFERENCE TO RELATED APPLICATION

This application claims priority from and the benefit of Korean Patent Application No. 10-2019-0007770, filed on Jan. 21, 2019, which is hereby incorporated by reference for all purposes as if fully set forth herein.

BACKGROUND

Field

Exemplary embodiments of the invention relate generally to an organic light-emitting display device and a method of manufacturing the same.

Discussion of the Background

A display device is a device which displays an image and includes a display panel such as an organic light-emitting display panel or a liquid crystal display panel.

An organic light-emitting diode display device (OLED display device) is a kind of self-luminous display device. The OLED display device includes an organic light-emitting layer interposed between a pixel electrode and a counter electrode. When the two electrodes inject electrons and holes into the organic light-emitting layer, electrons and holes recombine to form excitons, and the excitons transition from an excited state to a ground state so as to emit light.

In the OLED display device, in order to display a color, subpixels are formed so as to be divided into red, green, and blue subpixels, and an organic light-emitting layer corresponding to a color of a corresponding subpixel is formed in each subpixel. Generally, a deposition method using a shadow mask has been used for the organic light-emitting layer.

However, in a case in which a shadow mask has a large area, the shadow mask sags due to a dead load thereof, and as a result, when the shadow mask is used many times, a yield is lowered. Therefore, without a shadow mask, organic layers excluding the light-emitting layer are commonly formed in each subpixel without being separated.

However, recently, in structures in which a common layer is applied, due to a common layer commonly provided to subpixels, a current flows into a lateral portion through the common layer continuously formed in a planar fashion, thereby causing a problem of a lateral leakage current.

The above information disclosed in this Background section is only for understanding of the background of the inventive concepts, and, therefore, it may contain information that does not constitute prior art.

SUMMARY

Devices constructed according to exemplary embodiments of the invention are capable of preventing a lateral leakage current by disposing a pit or a spacer between subpixels to separate a common layer and a cathode electrode.

Additional features of the inventive concepts will be set forth in the description which follows, and in part will be apparent from the description, or may be learned by practice of the inventive concepts.

According to an exemplary embodiment of the inventive concepts, a display device includes a substrate which has a plurality of pixels each including an emission portion and a non-emission portion, a first electrode which is disposed on the emission portion, a pixel definition layer which is disposed on an edge of the first electrode and the non-emission portion, a common organic layer which is disposed on the first electrode and the pixel definition layer, an organic light-emitting layer which is disposed on the common organic layer and overlaps the emission portion and a second electrode which is disposed on the common organic layer and the organic light-emitting layer. The pixel definition layer includes a plurality of pits between adjacent pixels. The common organic layer and the second electrode are separated by the pits.

The common organic layer may include a hole injection layer and a hole transporting layer.

The pit may have a flat surface parallel to a top surface of the substrate and a side surface perpendicular to the top surface of the substrate.

Thicknesses of the common organic layer and the second electrode disposed on the side surface of the pit may be less than thicknesses of the common organic layer and the second electrode disposed on a top surface of the pixel definition layer.

The pixel may have a diamond shape in which a first subpixel and a second subpixel may be alternately disposed in an Y-axis direction and two third subpixels may be disposed in an X-direction perpendicular to the Y-axis direction between the first subpixel and the second subpixel.

The first to third subpixels may have different sizes.

The pit may be formed to be spaced a certain distance from each side of the first to third subpixels.

A length of the pit may be the same as a length of the side of each of the first to third subpixels.

The pit may be further formed to be spaced apart from each vertex of the first to third subpixels.

The display device may further include a thin film encapsulation layer disposed on the second electrode.

A touch sensor layer may be disposed on the thin film encapsulation layer.

The touch sensor layer may include sensing electrodes in a touch sensor region.

The sensing electrodes may overlap at least a portion of the plurality of pits.

The thin film encapsulation layer may include a first inorganic film, an organic film, and a second inorganic film.

The first inorganic film may be in direct contact with side surfaces of the separated common organic layer and the separated second electrode.

According to an exemplary embodiment of the inventive concepts, a display device includes a substrate which has a plurality of pixels each including an emission portion and a non-emission portion, a first electrode which is disposed on the emission portion, a pixel definition layer which is disposed on an edge of the first electrode and the non-emission portion, a common organic layer which is disposed on the first electrode and the pixel definition layer, an organic light-emitting layer which is disposed on the common organic layer and overlaps the emission portion, and a second electrode which is disposed on the common organic layer and the organic light-emitting layer. The pixel definition layer includes a plurality of spacers between adjacent pixels.

The common organic layer and the second electrode are separated by the spacers.

The common organic layer may include a hole injection layer and a hole transporting layer.

The spacer may have a top surface parallel to a top surface of the substrate and a side surface perpendicular to the top surface of the substrate.

Thicknesses of the common organic layer and the second electrode disposed on the side surface of the spacer may be less than those of the common organic layer and the second electrode disposed on a top surface of the pixel definition layer.

The pixels may have a diamond shape in which a first subpixel and a second subpixel may be alternately disposed in an Y-axis direction and two third subpixels may be disposed in an X-direction perpendicular to the Y-axis direction between the first subpixel and the second subpixel.

The first to third subpixels may have different sizes.

The spacer may be formed to be spaced a certain distance from each side of the first to third subpixels.

A length of the pit may be the same as a length of the side of the first to third subpixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
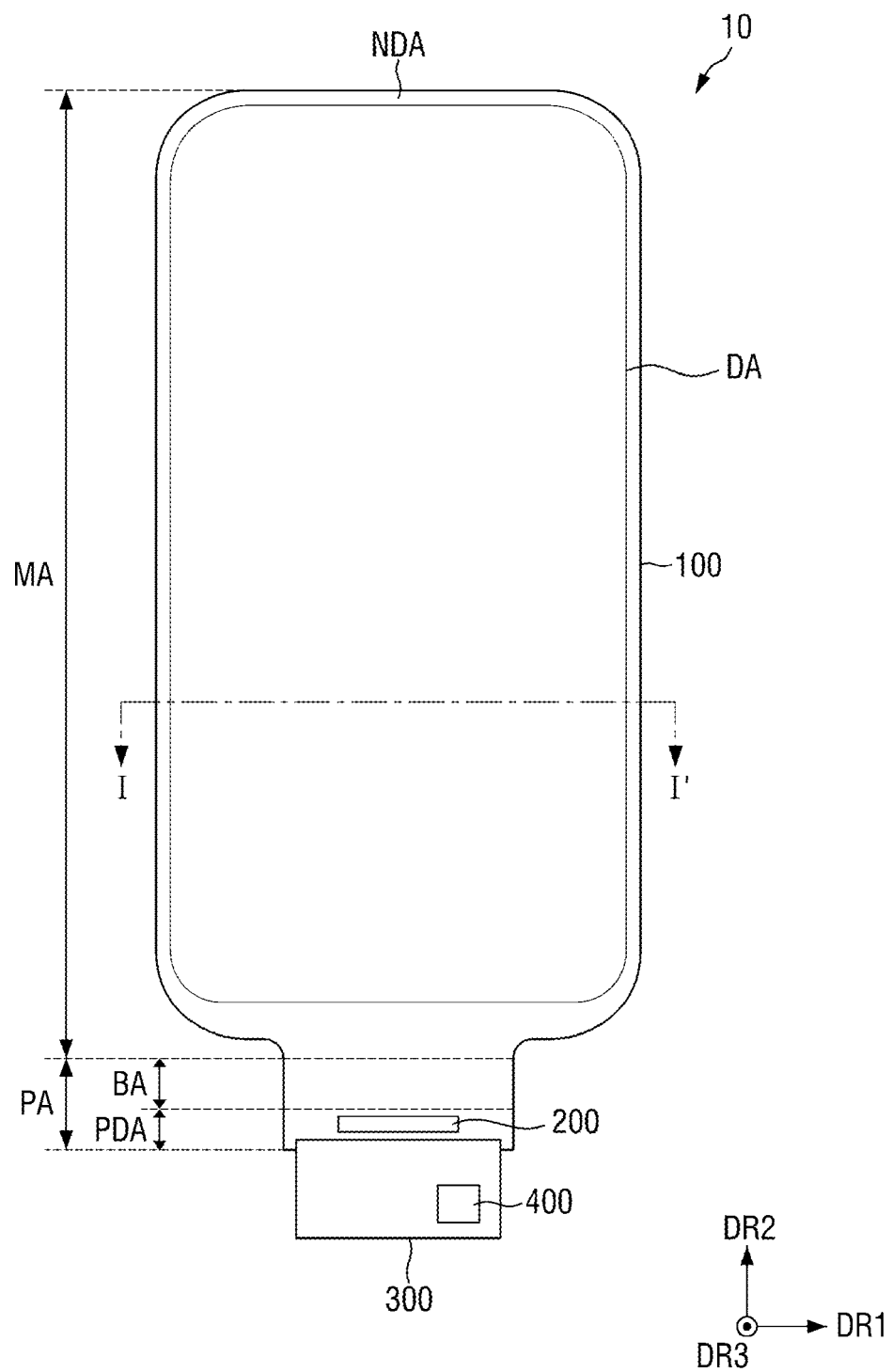
FIG. 1 is a plan view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
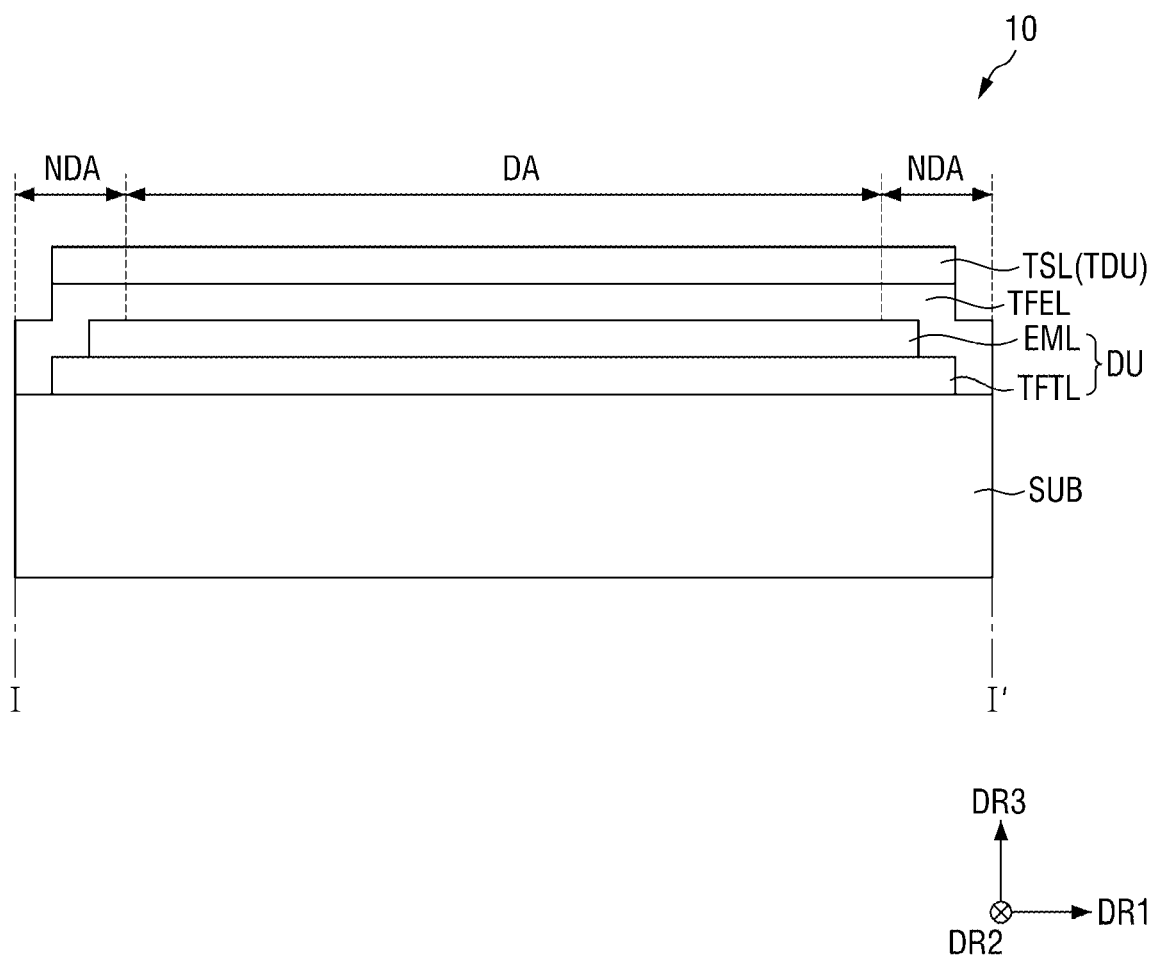
FIG. 2 is a cross-sectional view of an exemplary embodiment which is taken along line I-I' of FIG. 1.

FIG. 1 is a plan view illustrating a display device according to an exemplary embodiment, and FIG. 2 is a cross-sectional view of an exemplary embodiment which is taken along line I-I' of FIG. 1.

Referring to FIGS. 1 and 2, a display device 10 is a device which displays a still image or a moving image. The display device may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC) and may also be used as a display screen of various products such as a television, a notebook, a monitor, a billboard, and a device for Internet of things (IOT). The display device 10 may be any one of an organic light-emitting display device, a liquid crystal display device, a plasma display device, a field emission display device, an electrophoretic display device, an electro-wetting display device, a quantum dot light-emitting display device, and a micro light-emitting diode (LED) display device. Hereinafter, it will be mainly described that the display device 10 is the organic light-emitting display device, but the inventive concepts are not limited thereto.

The display device 10 according to the exemplary embodiment includes a display panel 100, a display driving circuit 200, a circuit board 300, and a touch driving circuit 400.

The display panel 100 may include a main region MA and a protrusion region PA protruding from one side of the main region MA.

The main region MA may be formed as a rectangular plane which has a short side in a first direction DR1 and a long side in a second direction DR2 intersecting with the first direction DR1. A corner at which the short side in the first direction DR1 meets the long side in the second direction DR2 may be rounded to have a certain curvature or formed at a right angle. A planar shape of the display device 10 is not limited to the rectangular shape but may be formed in another polygonal shape, circular shape, or elliptical shape.

The main region MA may be formed to be flat, but the inventive concepts are not limited thereto. The main region MA may include curved portions formed at left and right ends thereof. In this case, the curved portion may have a constant curvature or a variable curvature.

The main region MA may include a display region DA in which pixels are formed to display an image and a non-display region NDA which is a peripheral region of the display region DA.

Not only the pixels but also scan lines, data lines, and power lines connected to the pixels may be disposed in the display region DA. When the main region MA includes the curved portion, the display region DA may be disposed on the curved portion. In this case, an image of the display panel 100 may also be viewed on the curved portion.

The non-display region NDA may be defined as a region from an outermost portion of the display region DA to an edge of the display panel 100. A scan driver configured to apply scanning signals to the scan lines and link lines configured to connect the data lines and the display driving circuit 200 may be disposed in the non-display region NDA.

The protrusion region PA may protrude from one side of the main region MA. For example, the protrusion region PA may protrude from a lower side of the main region MA. A length of the protrusion region PA in the first direction DR1 may be less than a length of the main region MA in the first direction DR1.

The protrusion region PA may include a bending region BA and a pad region PDA. In this case, the pad region PDA may be disposed at one side of the bending region BA, and the main region MA may be disposed at the other side of the bending region BA. For example, the pad region PDA may be disposed at a lower side of the bending region BA, and the main region MA may be disposed at an upper side of the bending region BA.

The display panel 100 may be formed to be flexible so as to be bendable, foldable, or rollable. Therefore, the display panel 100 may be bent in a thickness direction DR3 from the bending region BA. In this case, before the display panel 100 is bent, one surface of the pad region PDA of the display panel 100 faces upward, and after the display panel 100 is bent, one surface of the pad region PDA of the display panel 100 faces downward. Accordingly, the pad region PDA may be disposed on a lower portion of the main region MA and thus may overlap the main region MA.

As shown in FIG. 2, in the main region MA, the display panel 100 may include a display unit DU which includes a thin film transistor TFTL, a light-emitting element layer EML, and a thin film encapsulation layer TFEL and a touch sensing unit TDU which includes a touch sensing layer TSL. The touch sensing unit TDU including the touch sensor layer TSL is illustrated in FIG. 2 as being included in the display panel 100, but the inventive concepts are not limited thereto. For example, the touch sensing unit TDU may be formed as a separate touch panel, and in this case, the separate touch panel may be attached onto the display panel 100.

Pads electrically connected to the display driving circuit 200 and the circuit board 300 may be disposed in the pad region PDA of the display panel 100.

The display driving circuit 200 outputs signals and voltages for driving the display panel 100. For example, the display driving circuit 200 may supply data voltages to the data lines. In addition, the display driving circuit 200 may supply a power supply voltage to the power line and may supply scan control signals to the scan driver. The display driving circuit 200 may be formed as an integrated circuit (IC) and may be mounted on the display panel 100 in the pad region PDA through a chip-on-glass (COG) method, a chip-on-plastic (COP) method, or an ultrasonic bonding method, but the inventive concepts are not limited thereto. For example, the display driving circuit 200 may be mounted on the circuit board 300.

The pads may include display pads electrically connected to the display driving circuit 200 and touch pads electrically connected to the touch lines.

The circuit board 300 may be attached onto the pads using an anisotropic conductive film. As a result, lead lines of the circuit board 300 may be electrically connected to the pads.

The circuit board 300 may be a flexible film such as a flexible printed circuit board, a printed circuit board, or a chip-on film.

The touch driving circuit 400 may be connected to touch electrodes of the touch sensor layer TSL of the display panel 100. The touch driving circuit 400 applies driving signals to the touch electrodes of the touch sensor layer TSL and measures capacitance values of the touch electrodes. The driving signal may be a signal having a plurality of driving pulses. The touch driving circuit 400 may determine whether a touch is input based on the capacitance values and may also calculate touch coordinates at which the touch is input.

The touch driving circuit 400 may be disposed on the circuit board 300. The touch driving circuit 400 may be formed as an IC and mounted on the circuit board 300.

FIG. 2 is a cross-sectional view of an exemplary embodiment which is taken along line I-I' of FIG. 1.

Referring to FIG. 2, the display panel 100 may include a substrate SUB, the display unit DU which includes the thin film transistor TFTL, the light-emitting element layer EML, and the thin film encapsulation layer TFEL which are disposed on the substrate SUB, and the touch sensing unit which includes the touch sensing layer TSL.

The substrate SUB may be made of an insulating material such as glass, quartz, or a polymer resin. For example, a polymeric material may include one selected from polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and a combination thereof. Alternatively, the substrate SUB may include a metal material.

The substrate SUB may be a rigid substrate or a flexible substrate which is bendable, foldable, and rollable. When the substrate SUB is the flexible substrate, the substrate SUB may be made of PI, but the inventive concepts are not limited thereto.

Figure 3:
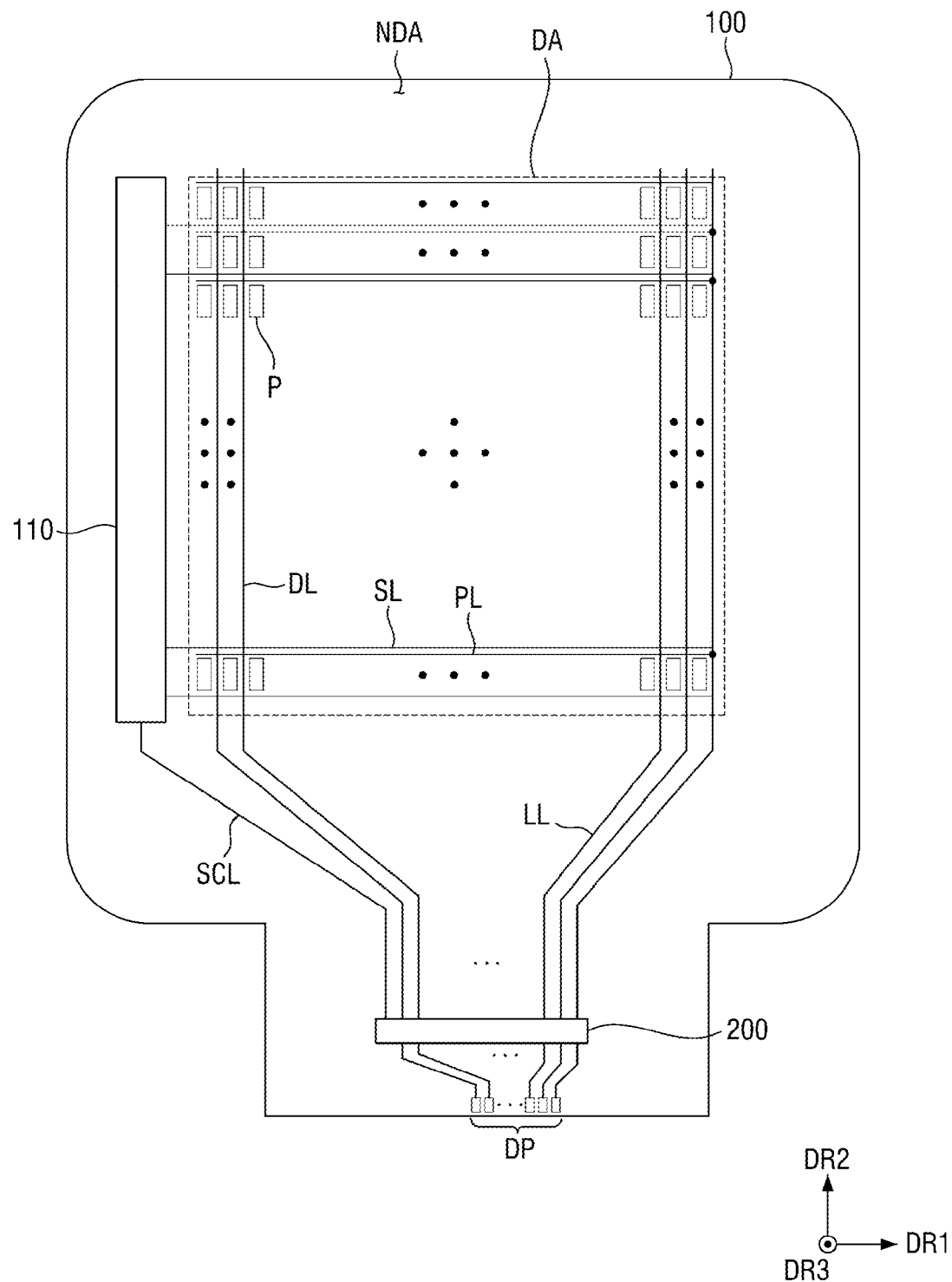
FIG. 3 is a plan view illustrating an exemplary embodiment of the display unit of FIG. 2 in detail.

The thin film transistor layer TFTL may be disposed on the substrate SUB. Not only thin film transistors of each pixel but also scan lines, data lines, power lines, scan control lines, and link lines connecting the pads and data lines are formed in the thin film transistor layer TFTL. Each of the thin film transistors may include a gate electrode, a semiconductor layer, a source electrode, and a drain electrode. When the scan driver 110 is formed in the non-display region NDA of the display panel 100 as shown in FIG. 3, the scan driver 110 may include thin film transistors.

The thin film transistor layer TFTL may be disposed in the display region DA and the non-display region NDA. Specifically, the thin film transistors of each of the pixels, the scan lines, the data lines, and the power lines of the thin film transistor layer TFTL may be disposed in the display region DA. The scan control lines and the link lines of the thin film transistor layer TFTL may be disposed in the non-display region NDA.

The light-emitting element layer EML may be disposed on the thin film transistor layer TFTL. The light-emitting element layer EML may include pixels which each include a first electrode, a light-emitting layer, and a second electrode, and a pixel definition layer. The light-emitting layer may be an organic light-emitting layer including an organic material. In this case, the light-emitting layer may include a hole transporting layer, an organic light-emitting layer, and an electron transporting layer. When a certain voltage is applied to the first electrode through the thin film transistor of the thin film transistor layer TFTL and a cathode voltage is applied to the second electrode, holes and electrons are moved to the organic light-emitting layer through the hole transporting layer and the electron transporting layer and are combined with each other in the light-emitting layer to emit light. The pixels of the light-emitting element layer EML may be disposed in the display region DA.

The thin film encapsulation layer TFEL may be disposed on the light-emitting element layer EML. The thin film encapsulation layer TFEL functions to prevent permeation of oxygen or moisture into the light-emitting element layer EML. To this end, the thin film encapsulation layer TFEL may include at least one inorganic film. The inorganic film may include a silicon nitride layer, a silicon oxynitride layer, a silicon oxide layer, a titanium oxide layer, or an aluminum oxide layer, but the inventive concepts are not limited thereto. In addition, the thin film encapsulation layer TFEL functions to protect the light-emitting element layer EML from foreign substances such as dust. To this end, the thin film encapsulation layer TFEL may include at least one organic film. The organic film may be made of acryl resin, epoxy resin, phenolicresin, polyamide resin, polyimide resin, or the like, but the inventive concepts are not limited thereto.

The thin film encapsulation layer TFEL may be disposed in both of the display region DA and the non-display region NDA. Specifically, the thin film encapsulation layer TFEL may cover the light-emitting element layer EML of the display region DA and the non-display region NDA and may be disposed to cover the thin film transistor layer TFTL of the non-display region NDA.

The touch sensor layer TSL may be disposed on the thin film encapsulation layer TFEL. Since the touch sensor layer TSL is disposed directly on the thin film encapsulation layer TFEL, a thickness of the display device 10 may be decreased as compared with a case in which a separate touch panel including the touch sensor layer TSL is attached onto the thin film encapsulation layer TFEL.

The touch sensor layer TSL may include touch electrodes for sensing a touch of a user using a capacitance method and touch lines for connecting pads and the touch electrodes. For example, the touch sensor layer TSL may sense the touch of the user using a self-capacitance method or a mutual capacitance method.

The touch electrodes of the touch sensor layer TSL may be disposed in the display region DA. The touch lines of the touch sensor layer TSL may be disposed in the non-display region NDA.

A cover window may be additionally disposed on the touch sensor layer TSL, and in this case, the touch sensor layer TSL and the cover window may be attached to each other by a transparent adhesive member.

FIG. 3 is a plan view illustrating an exemplary embodiment of the display unit of FIG. 2 in detail. For convenience of description, only pixels P, scan lines SL, data lines DL, a power line PL, scan control lines SCL, the scan driver 110, the display driving circuit 200, and display pads DP of the display unit DU are shown in FIG. 3.

Referring to FIG. 3, the scan lines SL, the data lines DL, the power line PL, and the pixels P are disposed in the display region DA. The scan lines SL may be formed in parallel in the first direction DR1 and the data lines DL may be formed in parallel in the second direction DR2 intersecting with the first direction DR1. The power line PL may include at least one line formed parallel to the data lines DL in the second direction DR2 and a plurality of lines branched from the at least one line in the first direction DR1.

Each of the pixels P may be connected to at least one of the scan lines SL, any one of the data lines DL, and the power line PL. Each of the pixels P may include thin film transistors including a driving transistor and at least one switching transistor, an organic light-emitting diode, and a capacitor. When a scan signal is applied from the scan line SL, each of the pixels P may receive a data voltage of the data line DL and may supply a driving current to the organic light-emitting diode in response to the received data voltage to emit light.

The scan driver 110 is connected to the display driving circuit 200 through at least one scan control line SCL. Therefore, the scan driver 110 may receive the scan control signal of the display driving circuit 200. The scan driver 110 generates scan signals in response to the scan control signal and supplies the scan signals to the scan lines SL.

The scan driver 110 is illustrated in FIG. 3 as being formed in the non-display region NDA outside a left side of the display region DA, but the inventive concepts are not limited thereto. For example, the scan driver 110 may be formed in the non-display region NDA outside left and/or right sides of the display region DA.

The display driving circuit 200 is connected to the display pads DP and receives digital video data and timing signals. The display driving circuit 200 converts the digital video data into analog positive/negative data voltages and supplies the analog positive/negative data voltages to the data lines DL through the link lines LL. Furthermore, the display driving circuit 200 generates and supplies a scan control signal for controlling the scan driver 110 through the scan control line SCL. The pixels P to which the data voltages are supplied are selected by the scan signals of the scan driver 110, and the data voltages are supplied to the selected pixels P. The display driving circuit 200 may be formed as an IC and may be mounted on the substrate SUB through a COG method, a COP method, or an ultrasonic bonding method.

Figure 4:
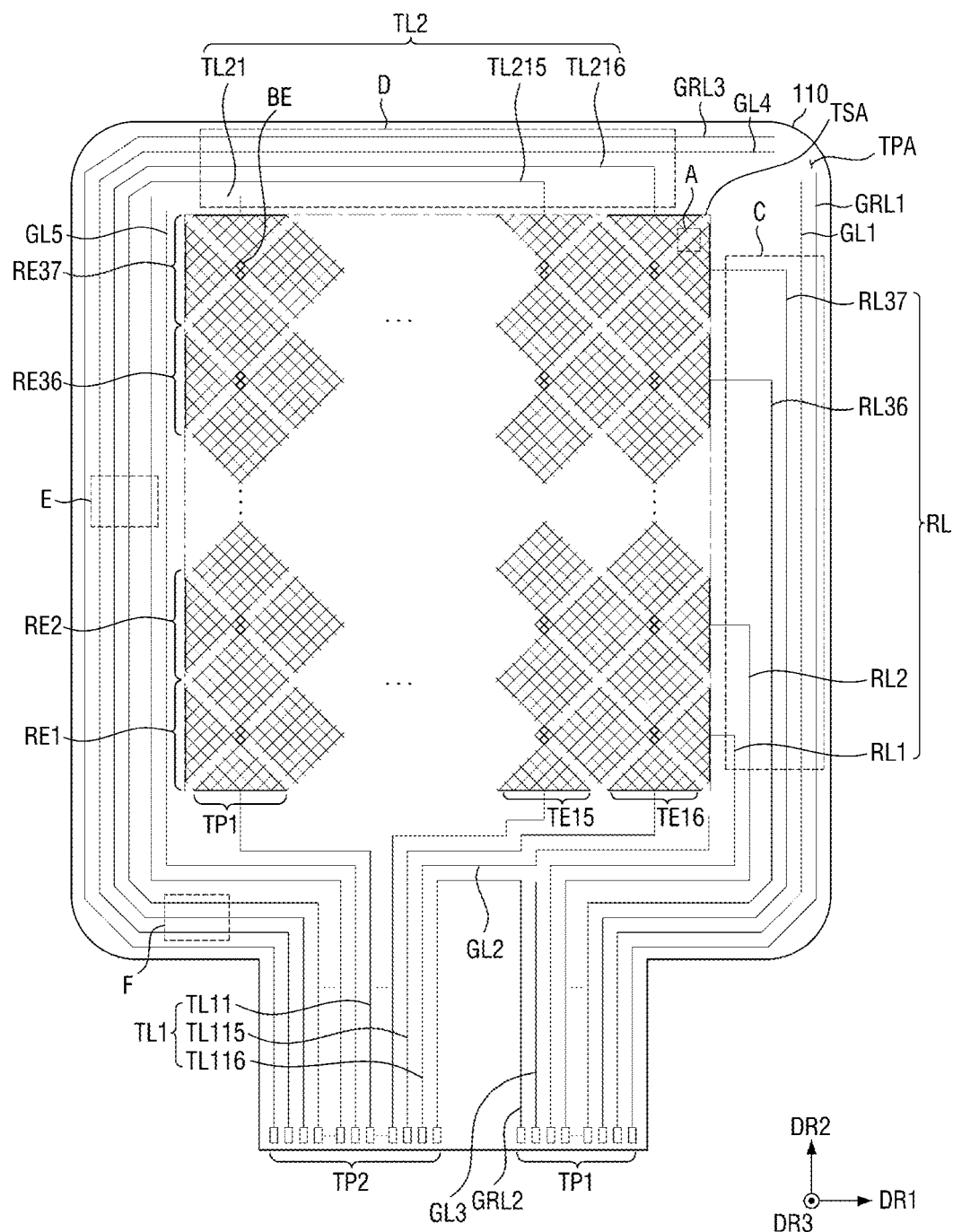
FIG. 4 is a plan view illustrating an exemplary embodiment of a touch sensing unit of FIG. 2 in detail.

FIG. 4 is a plan view illustrating an exemplary embodiment of the touch sensing unit of FIG. 2 in detail. For convenience of description, only touch electrodes TE and RE, touch lines TL and RL, and touch pads TP are shown in FIG. 4.

Referring to FIG. 4, the touch sensing unit TDU includes a touch sensor region TSA for sensing a touch of a user and a touch peripheral region TPA disposed at a periphery of the touch sensor region TSA. The touch sensor region TSA may overlap the display region DA of the display unit DU, and the touch peripheral region TPA may overlap the non-display region NDA of the display unit DU.

The touch electrodes TE and RE may be disposed in the touch sensor region TSA. The touch electrodes TE and RE may include sensing electrodes RE electrically connected in the first direction DR1 and driving electrodes TE electrically connected in the second direction DR2 intersecting with the first direction DR1. The sensing electrodes RE and the driving electrodes TE are illustrated in FIG. 4 as being formed in a diamond-like planar shape, but the inventive concepts are not limited thereto.

In order to prevent the sensing electrodes RE and the driving electrodes TE from being short-circuited to each other in intersection regions thereof, the driving electrodes TE adjacent to each other in the second direction DR2 may be electrically connected through a connection electrode BE. In this case, the driving electrodes TE and the sensing electrodes RE are disposed in one layer, and the connection electrode BE may be disposed in a layer different from the driving electrodes TE and the sensing electrodes RE. In addition, the sensing electrodes RE electrically connected in the first direction DR1 and the driving electrodes TE electrically coupled in the second direction DR2 are electrically insulated from each other.

The touch lines TL and RL may be disposed in the touch peripheral region TPA. The touch lines TL and RL may include sensing lines RL connected to the sensing electrodes RE and first and second driving lines TL1 and TL2 connected to the driving electrodes TE.

Specifically, among the sensing electrodes RE electrically connected in the first direction DR1, the sensing electrodes disposed at one side end may be connected to the sensing lines RL. The sensing lines RL may be connected to first touch pads TP1. Among the driving electrodes TE electrically connected in the second direction DR2, the driving electrodes TE disposed at one side end may be connected to first driving lines TL1 and the driving electrodes TE disposed at the other side end may be connected to second driving lines TL2. For example, the first driving lines TL1 may be connected to the driving electrodes TE at a lower side of the touch sensor region TSA, and the second driving lines TL2 may be connected to the driving electrodes TE at an upper side of the touch sensor region TSA. In this case, the second driving lines TL2 may pass outside a left side of the touch sensor region TSA and may be connected to the driving electrodes TE at the upper side of the touch sensor area TSA. The first driving lines TL1 and the second driving lines TL2 may be connected to second driving pads TP2. Accordingly, the touch driving circuit 400 may be electrically connected to the driving electrodes TE and the sensing electrodes RE.

The touch electrodes TE and RE may be driven through a mutual capacitance method or a self-capacitance method. First, when the touch electrodes TE and RE are driven through the mutual capacitance method, driving signals are supplied to the driving electrodes TE through the first driving lines TL1 and the second driving lines TL2 to charge mutual capacitances formed in intersection regions between the sensing electrodes RE and the driving electrodes TE. Then, charge change amounts of the sensing electrodes RE are measured through the sensing lines RL, and whether a touch is input is determined according to the charge change amounts of the sensing electrodes RE. The driving signal may be a signal having a plurality of driving pulses.

Second, when the touch electrodes TE and RE are driven through the self-capacitance method, driving signals are supplied to the driving electrodes TE and the sensing electrodes RE through the first driving lines TL1, the second driving lines TL2, and the sensing lines RL to charge self-capacitances of the driving electrodes TE and the sensing electrodes RE. Then, charge change amounts of the self-capacitances of the driving electrodes TE and the sensing electrodes RE are measured through the first driving lines TL1, the second driving lines TL2, and the sensing lines RL, and whether a touch is input is determined according to the charge change amounts of the self-capacitances.

The driving electrodes TE and the sensing electrodes RE may be formed as mesh-shaped electrodes. When the touch sensor layer TSL including the driving electrodes TE and the sensing electrodes RE is formed directly on the thin film encapsulation film TFEL as shown in FIG. 2, a distance between the second electrode of the light-emitting element layer EML and the driving electrodes TE or the sensing electrodes RE of the touch sensor layer TSL may be short. Accordingly, very high parasitic capacitance may be formed between the second electrode of the light-emitting element layer EML and the driving electrodes TE or the sensing electrodes RE of the touch sensor layer TSL. In order to reduce the parasitic capacitance, the driving electrodes TE and the sensing electrodes RE may be formed as the mesh-shaped electrodes as shown in FIG. 4 rather than a box electrode of a conductive layer made of a transparent oxide such as indium tin oxide (ITO) or indium zinc oxide (IZO).

Figure 5:
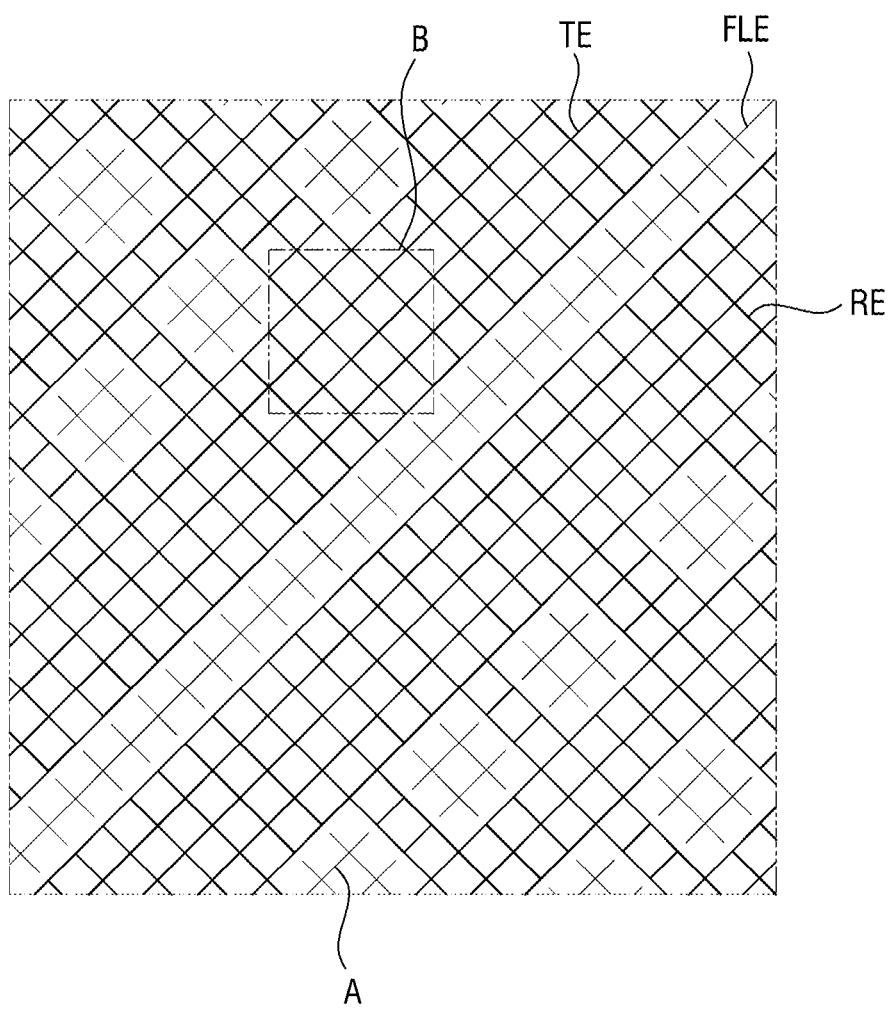
FIG. 5 is an enlarged plan view illustrating an exemplary embodiment of region A of FIG. 4.

In addition, as shown in FIG. 5, floating electrodes FLE may be disposed to be spaced apart from the driving electrodes TE and the sensing electrodes RE. The floating electrodes FLE may be disposed between the driving electrodes TE and the sensing electrodes RE or may be disposed to be surrounded by the driving electrodes TE or surrounded by the sensing electrodes RE. The floating electrodes FLE may be formed as mesh-shaped electrodes. No voltage is applied to the floating electrodes FLE. As an area of the floating electrodes FLE is increased, the parasitic capacitance between the second electrode of the light-emitting device layer EML and the driving electrodes TE or the sensing electrodes RE of the touch sensor layer TSL may be decreased, but the mutual capacitance between the driving electrodes TE and the sensing electrodes RE may also be decreased. When the parasitic capacitance is decreased, a charging speed at which the mutual capacitance is charged may be increased. However, when the mutual capacitance is decreased, an influence of touch noise may be increased. Therefore, the area of the floating electrodes FLE may be appropriately set in consideration of the parasitic capacitance and the mutual capacitance.

Hereinafter, for convenience of description, sensing electrodes RE disposed in a $j^{th}$ row (j is a positive integer) in the first direction DR1 will be defined as $j^{th}$ row sensing electrodes REj, and a sensing line connected to the $j^{th}$ row electrodes REj will be defined as the $j^{th}$ sensing line RLj. In this case, a sensing line connected to first row sensing electrodes RE1 may be connected to a first sensing line RL1. A sensing line connected to second row sensing electrodes RE2 may be a second sensing line RL2. A sensing line connected to $36^{th}$ row sensing electrodes RE36 may be a $36^{th}$ sensing line RL36. A sensing line connected to $37^{th}$ row sensing electrodes RE37 may be a $37^{th}$ sensing line RL37. Here, the first row may be a row disposed at a bottom side, and the $37^{th}$ row may be a row disposed at a top side. For convenience of description, the sensing electrodes RE are illustrated in FIG. 4 as being disposed in 37 rows, but the number of the rows in which the sensing electrodes RE are disposed is not limited to 37. Among the sensing lines RL, the first sensing line RL1 may be disposed closest to the touch sensor region TSA, and the $37^{th}$ sensing line RL37 may be disposed farthest from the touch sensor region TSA.

On the other hand, among the sensing electrodes RE, the $37^{th}$ row sensing electrodes RE37 may be disposed farthest from the first touch pads TP1, and the first row sensing electrodes RE1 may be disposed closest to the first touch pads TP1. Therefore, among the sensing lines RL, the $37^{th}$ sensing line RL37 is the longest, and the first sensing line RL1 is the shortest.

In addition, for convenience of description, driving electrodes TE disposed in a $k^{th}$ column (k is a positive integer) in the second direction DR2 will be defined as $k^{th}$ column driving electrodes TEk. A driving line connected to one side of the $k^{th}$ column driving electrodes TEk will be defined as a $1^{st}$-k driving line TL1$k$, and a driving line connected to the other side of the $k^{th}$ column driving electrodes TEk will be defined as a $2^{nd}$-k driving line TL2$k$. In this case, a driving line connected to one side of first driving electrodes TE1 may be a $1^{st}$-1 driving line TL11, and a driving line connected to the other side of the first driving electrodes TE1 may be a $2^{nd}$-1 driving line TL21. A driving line connected to one side of second driving electrodes TE2 may be a $1^{st}$-2 driving line TL12, and a driving line connected to the other side of the second driving electrodes TE2 may be a $2^{nd}$-2 driving line. A driving line collected to 15th driving electrodes TE15 may be a $1^{nd}$-15 driving line TL115, and a driving line connected to the other side of the $15^{th}$ driving electrodes TL15 may be a $2^{nd}$-15 driving line TL215. A driving line connected to one side of the 16th driving electrodes TE16 may be a $1^{nd}$-16 driving line TL116, and a driving line connected to the 16th driving electrodes TE16 may be a 2-$1^{st}$-16 driving line TL216. Here, a first column may be the leftmost column, and a $16^{th}$ column may be the rightmost column. For convenience of description, the driving electrodes TE are illustrated in FIG. 4 as being disposed in 16 columns, but the number of the columns in which the driving electrodes TE are disposed is not limited to 16. Among second driving lines TL2, the $2^{nd}$-1 driving line TL2 may be disposed closest to the touch sensor region TSA, and the $2^{nd}$-16 sensing line RL216 may be farthest from the touch sensor region TSA.

On the other hand, among the driving electrodes TE, an upper side of the $16^{th}$ driving electrodes TE16 is disposed farthest from the second touch pads TP2, and an upper side of the first driving electrodes TE1 is disposed closest to the second touch pads TP2. Therefore, among the driving lines TL, the $2^{nd}$-16 driving line TL216 is the longest, and the $2^{nd}$-1 driving line TL21 is the shortest.

A first guard line GL1 may be disposed outside the $37^{th}$ sensing line RL37 disposed at an outermost side among the sensing lines RL. In addition, a first ground line GRL1 may be disposed outside the first guard line GL1. That is, since the $37^{th}$ sensing line RL37 is disposed at a right side end among the sensing lines RL, the first guard line GL1 is disposed at a right side of the $37^{th}$ sensing line RL37, and the first ground line GRL1 may be disposed at a right side of the first ground line GRL1.

A second guard line GL2 may be disposed between the first sensing line RL1 disposed at an innermost side among the sensing lines RL and the $1^{st}$-16 driving line TL116. In addition, the second guard line GL2 may be disposed between the $1^{st}$-16 driving line TL116 and a second ground line GRL2. Furthermore, a third guard line GL3 may be disposed between the first sensing line RL1 and the second ground line GRL2. The second ground line GRL2 may be connected to a first touch pad disposed at an innermost side among the first touch pads TP1 and a second touch pad disposed at an innermost side among the second touch pads TP2.

A fourth guard line GL4 may be disposed outside the $2^{nd}$-16 driving line TL216 disposed at an outermost side of the second driving lines TL2. In addition, a third ground line GRL3 may be disposed outside the fourth guard line GL4. That is, since the $2^{nd}$-16 driving line TL216 is disposed at left and upper side ends among the second driving lines TL2, the fourth guard line GL4 may be disposed at left and upper sides of the $2^{nd}$-16 driving line TL216, and the third ground line GRL3 may be disposed at left and upper sides of the fourth guard line GL4.

A fifth guard line GL5 may be disposed inside the $2^{nd}$-1 driving line TL21 disposed in an innermost side among the second driving lines TL2. That is, the fifth guard line GL5 may be disposed between the $2^{nd}$-$1^{st}$ driving line TL21 and the touch electrodes TE and RE.

According to the exemplary embodiment shown in FIG. 4, the first ground line GRL1, the second ground line GRL2, and the third ground line GRL3 are disposed at outermost sides of upper, left, and right sides of the display panel 100. A ground voltage is applied to the first ground line GRL1, the second ground line GRL2, and the third ground line GRL3. As a result, when static electricity is applied from the outside, the static electricity may be discharged to the first ground line GRL1, the second ground line GRL2, and the third ground line GRL3.

In addition, according to the exemplary embodiment shown in FIG. 4, since the first guard line GL1 is disposed between a sensing line disposed at the outermost side, that is, the $37^{th}$ sensing line RL37 and the first ground line GRL1, the first guide line GL1 may function to minimize the $37^{th}$ sensing line RL37 being influenced by a change in voltage of the first ground line GRL1. The second guard line GL2 is disposed between a sensing line disposed at an inner most side and a first driving line disposed at an outermost side, i.e., between the first sensing line RL1 and the $1^{st}$-16 driving line TL116. Thus, the second guard line GL2 may function to minimize the first sensing line RL1 and the $1^{st}$-16 driving line TL116 being influenced by each other. Since the third guard line GL3 is disposed between a sensing line disposed at the innermost side, that is, the first sensing line RL1 and the second ground line GRL2, the third guide line GL3 may function to minimize the first sensing line RL1 being influenced by a change in voltage of the second ground line GRL2. Since the fourth guard line GL4 is disposed between a second driving line disposed at the outermost side, that is, the $2^{nd}$-16 driving line TL216 and the third ground line GRL3, the fourth guide line GL4 may function to minimize the 2-$16^{th}$ driving line TL216 being influenced by a change in voltage of the third ground line GRL3. Since the fifth guard line GL5 is disposed between a second driving line disposed at the innermost side, that is, the $2^{nd}$-1 driving line TL21 and the touch electrodes TE and RE, the fifth guide line GL5 may function to minimize the $2^{nd}$-1 driving line TL21 and the touch electrodes TE and RE being influenced by each other.

To this end, when the touch electrodes TE and RE are driven through the mutual capacitance method, a ground voltage may be applied to the first guard line GL1, the second guard line GL2, the third guard line GL3, the fourth guard line GL4, and the fifth guard line GL5. In addition, when the touch electrodes TE and RE are driven through the self-capacitance method, the same driving signals as the driving signals applied to the first driving lines TL1, the second driving lines TL2, and the sensing lines RL may be applied to the first guard line GL1, the second guard line GL2, the third guard line GL3, the fourth guard line GL4, and the fifth guard line GL5.

Figure 6:
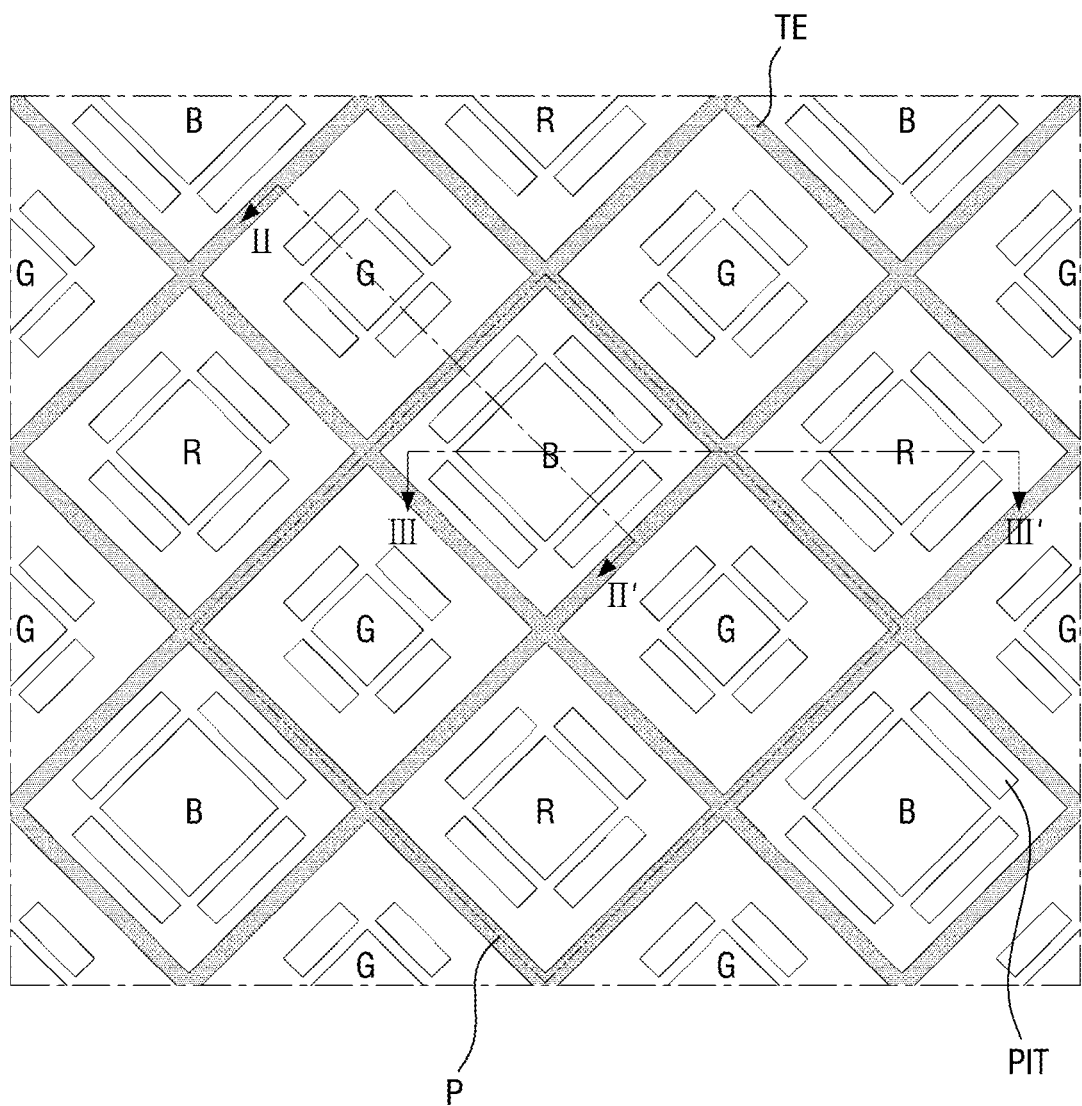
FIG. 6 is an enlarged plan view illustrating an exemplary embodiment of region B of FIG. 5.
Figure 7:
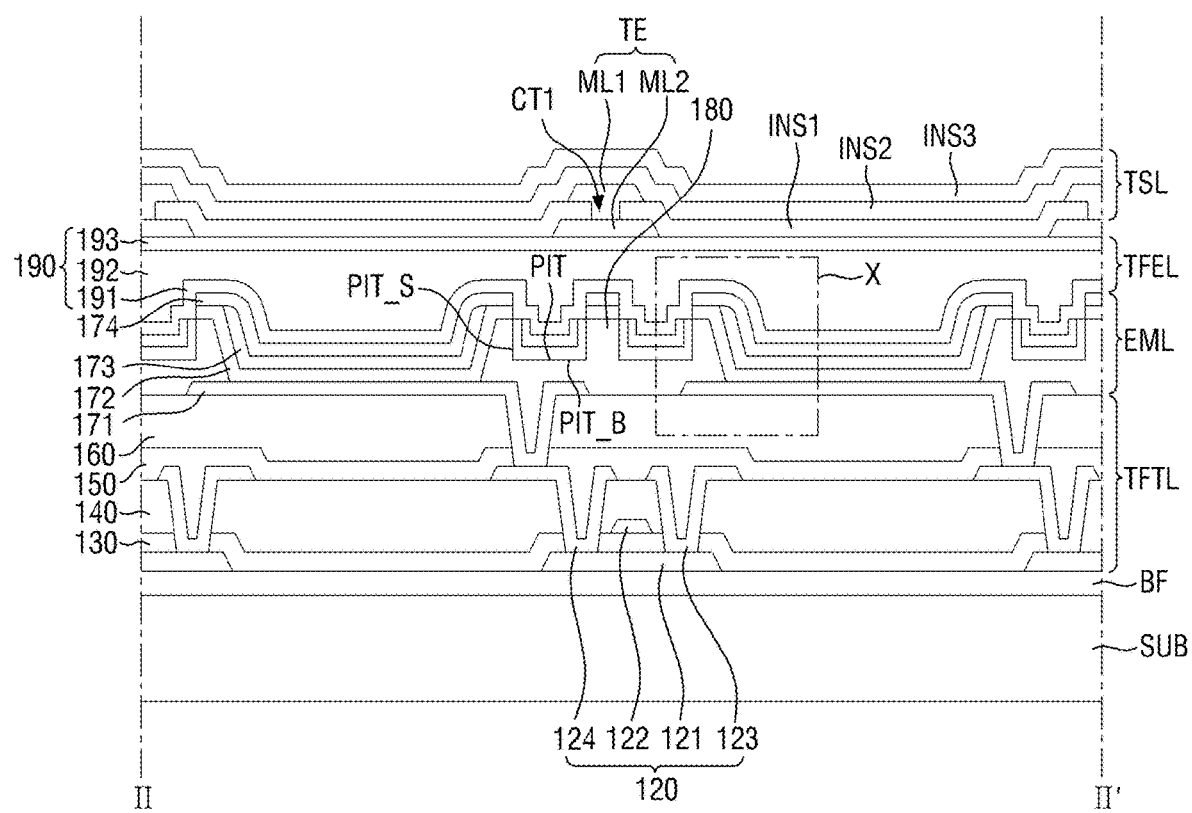
FIG. 7 is a cross-sectional view of an exemplary embodiment which is taken along line II-II' of FIG. 6.
Figure 8:
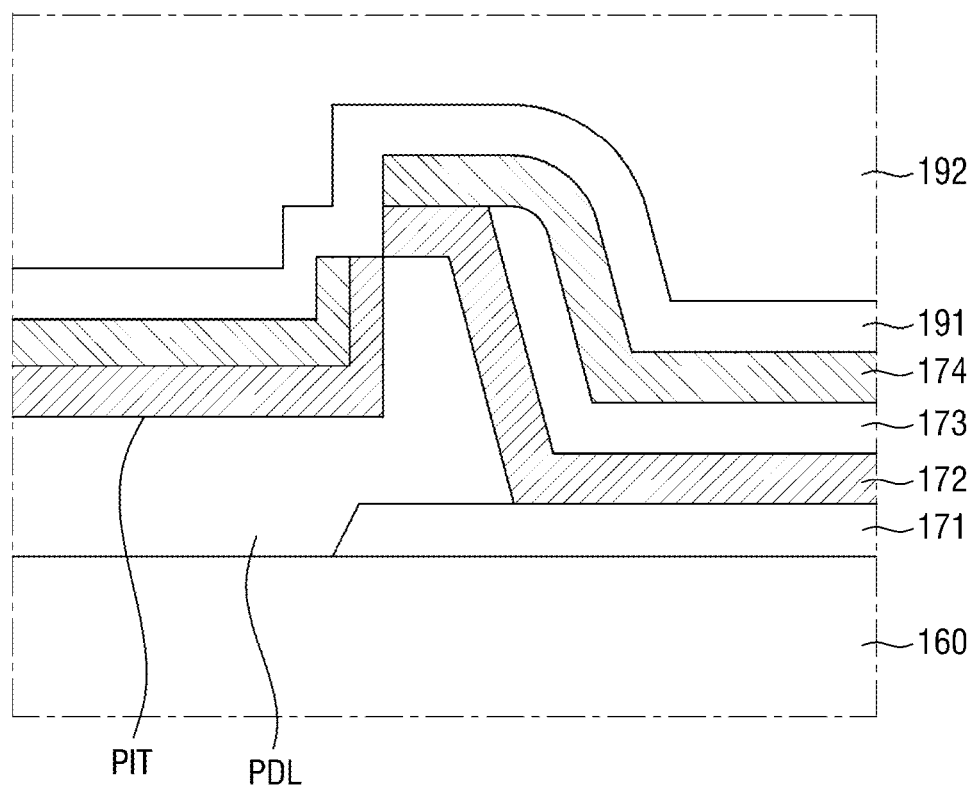
FIG. 8 is an enlarged view illustrating portion X of FIG. 7.
Figure 9:
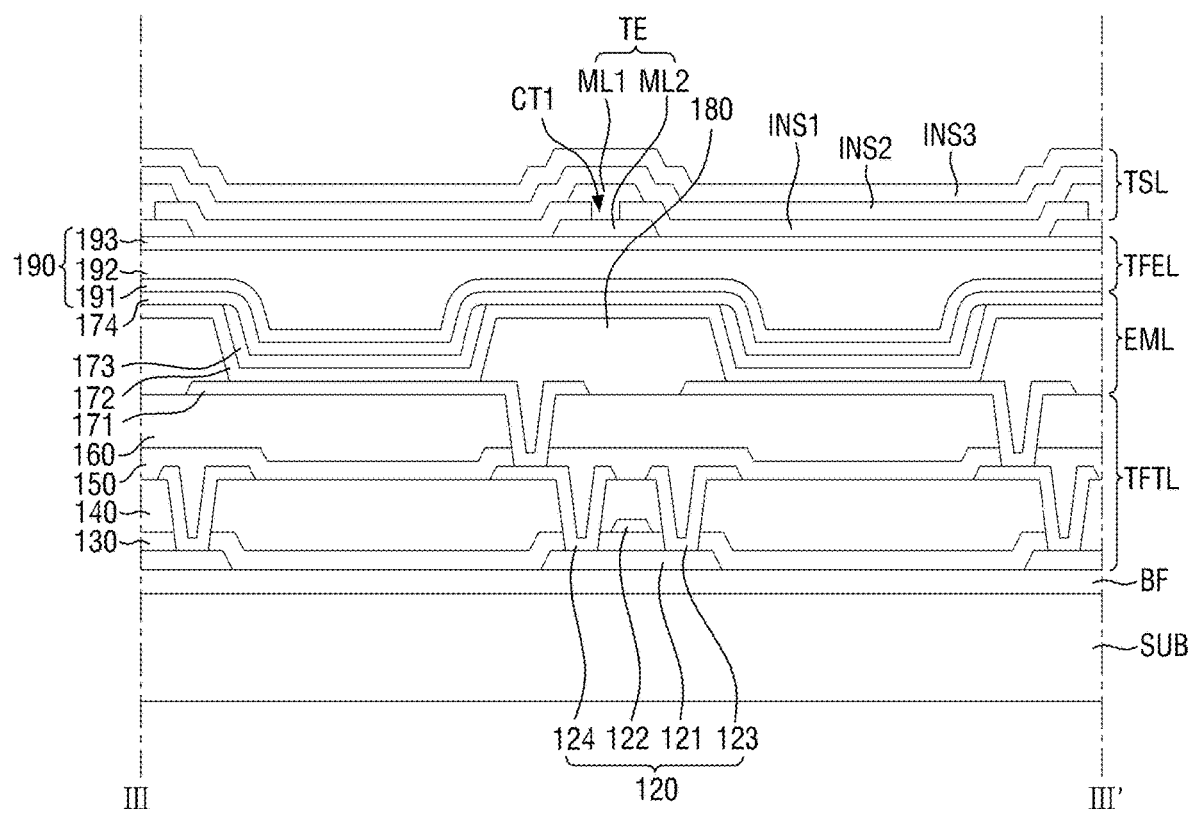
FIG. 9 is a cross-sectional view of an exemplary embodiment which is taken along line of FIG. 6.

FIG. 6 is an enlarged plan view illustrating an exemplary embodiment of region B of FIG. 5. FIG. 7 is a cross-sectional view of an exemplary embodiment which is taken along line II-II' of FIG. 6. FIG. 8 is an enlarged view illustrating portion X of FIG. 7. FIG. 9 is a cross-sectional view of an exemplary embodiment which is taken along line of FIG. 6.

Referring to FIGS. 6 and 7, a thin film transistor layer TFTL is formed on a substrate SUB. The thin film transistor layer TFTL includes thin film transistors 120, a gate insulating film 130, an interlayer insulating film 140, a protective film 150, and a planarizing film 160.

A buffer film BF may be formed on one surface of the substrate SUB. The buffer film BF may be formed on one surface of the substrate SUB to protect the thin film transistors 120 and an organic light-emitting layer 173 of the light-emitting element layer EML from moisture permeating through the substrate SUB susceptible to moisture transmission. The buffer film BF may include a plurality of inorganic films which are alternately stacked. For example, the buffer film BF may be formed as multiple films in which one or more inorganic films among a silicon nitride layer, a silicon oxynitride layer, a silicon oxide layer, a titanium oxide layer, and an aluminum oxide layer are alternately stacked. The buffer film BF may be omitted.

The thin film transistor 120 is formed on the buffer film BF. The thin film transistor 120 includes an active layer 121, a gate electrode 122, a source electrode 123, and a drain electrode 124. The thin film transistor 120 is illustrated in FIG. 7 as being formed in a top gate type in which the gate electrode 122 is disposed on the active layer 121, but the inventive concepts are not limited thereto. That is, the thin film transistors 210 may be formed in a bottom gate type in which the gate electrode 122 is disposed below the active layer 121 or a double gate type in which the gate electrode 122 is disposed on both of upper and lower portions of the active layer 121.

The active layer 121 is formed on the buffer film. The active layer 121 may include polycrystalline silicon, single crystal silicon, low temperature polycrystalline silicon, amorphous silicon, or an oxide semiconductor. For example, the oxide semiconductor may include a binary compound ($AB_x$), a ternary compound ($AB_xC_y$), or a quaternary compound ($AB_xC_yD_z$), which includes indium, zinc, gallium, tin, titanium, aluminum, hafnium (Hf), zirconium (Zr), magnesium (Mg), and the like. For example, the active layer 121 may include ITZO (an oxide including indium, tin, and titanium) or IGZO (an oxide including indium, gallium, and tin). A light blocking layer configured to block external light incident on the active layer 121 may be formed between the buffer layer and the active layer 121.

The gate insulating film 130 may be formed on the active layer 121. The gate insulating film 130 may be formed as an inorganic film, for example, a silicon nitride layer, a silicon oxynitride layer, a silicon oxide layer, a titanium oxide layer, or an aluminum oxide layer.

The gate electrode 122 and a gate line may be formed on the gate insulating film 130. The gate electrode 122 and the gate line may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The interlayer insulating film 140 may be formed on the gate electrode 122 and the gate line. The interlayer insulating film 140 may be formed as an inorganic film, for example, a silicon nitride layer, a silicon oxynitride layer, a silicon oxide layer, a titanium oxide layer, or an aluminum oxide layer.

The source electrode 123 and the drain electrode 124 may be formed on the interlayer insulating film 140. Each of the source electrode 123 and the drain electrode 124 may be connected to the active layer 121 through a contact hole passing through the gate insulating film 130 and the interlayer insulating film 140. The source electrode 123 and the drain electrode 124 may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The protective film 150 may be formed on the source electrode 123 and the drain electrode 124 to insulate the thin film transistor 120. The protective film 150 may be formed as an inorganic film, for example, a silicon nitride layer, a silicon oxynitride layer, a silicon oxide layer, a titanium oxide layer, or an aluminum oxide layer.

The planarizing film 160 may be formed on the protective film 150 to planarize a stepped portion due to the thin film transistor 120. The planarizing film 160 may be formed as an organic film made of acryl resin, epoxy resin, phenolic resin, polyamide resin, polyimide resin, or the like.

The light-emitting element layer EML may be formed on the thin film transistor layer TFTL. The light-emitting element layer EML may include the light-emitting elements 170 and a pixel definition layer 180.

The light-emitting elements 170 and the pixel definition layer 180 are formed on the planarizing film 160. Each of the light-emitting elements 170 may include a first electrode 171, a common organic layer 172, an organic light-emitting layer 173, and a second electrode 174.

The first electrode 171 may be formed on the planarizing film 160. The first electrode 171 is connected to the drain electrode 124 of the thin film transistor 120 through a contact hole passing through the protective film 150 and the planarizing film 160.

In a top emission structure in which light is emitted in the direction of the second electrode 174 with respect to the organic light-emitting layer 173, the first electrode 171 may be made of a metal material having high reflectivity, and for example, may include a stacked structure (Ti/Al/Ti) of aluminum and titanium, a stacked structure (ITO/Al/ITO) of aluminum and ITO, an silver-palladium-copper (APC) alloy, and a stacked structure (ITO/APC/ITO) of ITO and an APC alloy. The APC alloy is an alloy of silver (Ag), palladium (Pd), and copper (Cu).

In a bottom emission structure in which light is emitted in the direction of the first electrode 171 with respect to the organic light-emitting layer 173, the first electrode 171 may be made of a transparent conductive material (TCO) capable of transmitting light, such as ITO or IZO, or may be made of a semi-transmissive conductive material such as magnesium (Mg), silver (Ag), or an alloy of magnesium (Mg) and silver (Ag). In this case, when the first electrode 171 is made of the semi-transmissive conductive material, luminous efficiency may be improved due to a microcavity.

The pixel definition layer 180 may be formed to partition the first electrode 171 on the planarizing film 160 to function as a pixel definition layer for defining subpixels R, G, and B. The pixel definition layer 180 may be formed to cover an edge of the first electrode 171. The pixel definition layer 180 may be formed as an organic film made of acryl resin, epoxy resin, phenolic resin, polyamide resin, polyimide resin, or the like.

A pair of pits PIT which are recessed may be formed in the pixel definition layer 180.

Referring to FIG. 6, the pits PIT may be disposed to surround each of the subpixels R, G, and B. According to an exemplary embodiment, a separate PIT may be disposed in each side of a subpixel having a rectangular shape, and a total of four pits PIT may be included in one subpixel. Therefore, two pits PIT may be disposed between adjacent two subpixels of the subpixels R, G, and B.

The pit PIT may be formed to have the same length as each side of adjacent subpixels R, G, and B. Since the pit PIT is formed to be spaced apart from each of the subpixels R, G, and B by a certain distance, the pit PIT may not be formed in a region adjacent to each vertex of the subpixels.

In FIG. 6, it has been described that four pits PIT are included in every one subpixel R, G, or B and the shape of the pits PIT is a rectangular shape, but the inventive concepts are not limited thereto. The number and shape of the pits PIT formed every one subpixel R, G, or B may be variously modified. This will be described in detail with reference to FIGS. 12 and 13.

Referring to FIG. 7, the pair of pits PIT may be formed on the pixel definition layer 180. According to an exemplary embodiment, the pit PIT may include a flat surface PIT_B formed parallel to the planarizing film 160 and a side surface PIT_S extending in a direction perpendicular to the planarizing film 160. At least a portion of the flat surface PIT_B may overlap a driving electrode TE in a thickness direction thereof. A height of the side surface PIT_S may correspond to about half a height of the pixel definition layer 180, but the inventive concepts are not limited thereto.

Each of the subpixels R, G, and B refers to a region in which the first electrode 171, the common organic layer 172, the organic light-emitting layer 173, and the second electrode 174 are sequentially stacked and holes from the first electrode 171 and electrons from the second electrode 174 are combined with each other in the organic light-emitting layer 173 to emit light.

On the other hand, as shown in FIG. 6, one red subpixel R, one blue subpixel B, and two green subpixels G may be defined as one pixel P. An area of the blue subpixel B may be greater than an area of the red subpixel R, and the area of the red subpixel R may be greater than an area of the green subpixel G. In addition, the red subpixel R, the green subpixel G, and the blue subpixel B are illustrated in FIG. 6 as having a rectangular planar shape, but the inventive concepts are not limited thereto. The red subpixel R, the green subpixel G, and the blue subpixel B may have a polygonal, circular, or elliptical planar shape other than a rectangular shape.

The common organic layer 172 is formed on the first electrode 171 and the pixel definition layer 180. The common organic layer 172 may be a common layer commonly formed on the first electrode 171 and the pixel definition layer 180 and may include a hole injection layer and a hole transporting layer. Since a p-type dopant having high conductivity is used in the hole injection layer, when the hole injection layer is connected between adjacent subpixels, the hole injection layer may be a major cause of a lateral leakage current.

The common organic layer 172 may be formed through a deposition process or a solution process. When the common organic layer 172 is formed through the deposition process, the common organic layer 172 may be formed through an evaporation deposition method. A film formed through the evaporation deposition method has low step coverage characteristics. Accordingly, when an angle of the side surface PIT_S of the pit PIT is greater than about 50°, a thickness of the common organic layer 172 on the side surface PIT_S of the pit PIT may be less than a thickness of the common organic layer 172 on an inclined surface of the pixel definition layer 180.

For example, when the angle of the side surface PIT_S of the pit PIT recessed on the pixel definition layer 180 is 90°, the common organic layer 172 stacked on an upper surface of the pixel definition layer 180 may be separated from the common organic layer 172 stacked on the side surface PIT_S of the pit PIT.

When the common organic layer 172 is formed as a common layer in adjacent subpixels R, G, and B, the common organic layer 172 may become a transport path of holes. As shown in FIG. 9, when the common organic layer 172 is formed so as to be separated on the upper surface of the pixel definition layer 180 and the side surface PIT_S of the pit PIT, a transport path of holes of the blue subpixel B is cut off, and thus, it may be difficult to move the holes to the adjacent green subpixel G. That is, a leakage path of a current may be minimized due to the pit PIT, and thus minimizing the adjacent pixel being influenced due to a leakage current through the common organic layer 172. Unlike the common organic layer 172, the organic light-emitting layer 173 may be formed for each of the subpixels R, G, and B. The organic light-emitting layer 173 may include an organic material to emit a certain color. In this case, the organic light-emitting layer 173 of the red subpixel R may emit red light, the organic light-emitting layer 173 of the green subpixel G may emit green light, and the organic light-emitting layer 173 of the blue subpixel B may emit blue light. Alternatively, the organic light-emitting layers 173 of the subpixels R, G, and B may emit white light. In this case, the red subpixel R may further include a red color filter layer, the green subpixel G may further include a green color filter layer, and the blue subpixel B may further include a blue color filter layer.

The second electrode 174 is formed on the common organic layer 172 and the organic light-emitting layer 173. The second electrode 174 may be formed to cover the common organic layer 172 and the organic light-emitting layer 173. The second electrode 174 may be a common layer commonly formed in the pixels P. Since holes may be moved through the second electrode 174, the second electrode 174 connects adjacent pixels, and the second electrode 174 may be another cause of a lateral leakage current. A capping layer may be formed on the second electrode 174.

The second electrode 174 includes a metal as a component thereof, and the metal has characteristics of being randomly deposited due to diffuse reflection characteristics of particles thereof as compared with an organic material. Thus, the second electrode 174 has excellent coverage characteristics. However, when the angle of the side surface PIT_S of the pit PIT recessed on the pixel definition layer 180 is 90°, the second electrode 174 stacked on the upper surface of the pixel definition layer 180 may be separated from the second electrode 174 stacked on the side surface PIT_S of the pit PIT.

When the second electrode 174 is commonly formed in adjacent subpixels R, G, and B, the second electrode 174 may become a transport path of holes. As shown in FIG. 8, when the second electrode 174 is formed so as to be separated on the upper surface of the pixel definition layer 180 and the side surface PIT_S of the pit PIT, a path may be cut off along which holes of the blue subpixel B are able to detour. Thus, it may be difficult to move the holes to the adjacent green subpixel G. That is, a leakage path of a current may be minimized due to the pit PIT, and thus minimizing the adjacent pixel being influenced due to a leakage current through the second electrode 174.

In a top emission structure, the second electrode 174 may be made of a transparent conductive material (TCO) capable of transmitting light, such as ITO or IZO or may be made of a semi-transmissive conductive material such as magnesium (Mg), silver (Ag), or an alloy of magnesium (Mg) and silver (Ag). When the second electrode 174 is made of the semi-transmissive conductive material, luminous efficiency may be improved due to a microcavity.

In a bottom emission structure, the second electrode 174 may be made of a metal material having high reflectivity, and for example, may include a stacked structure (Ti/Al/Ti) of aluminum and titanium, a stacked structure (ITO/Al/ITO) of aluminum and ITO, an APC alloy, and a stacked structure (ITO/APC/ITO) of ITO and an APC alloy. The APC alloy is an alloy of silver (Ag), palladium (Pd), and copper (Cu).

The thin film encapsulation layer TFEL may be disposed on the light-emitting element layer EML. The thin film encapsulation layer TFEL includes an encapsulation film 190.

The encapsulation film 190 is disposed on the second electrode 174. The encapsulation film 190 may include at least one inorganic film 191 or 193 to prevent permeation of oxygen or moisture into the organic light-emitting layer 173 and the second electrode 174. In addition, the thin film encapsulation layer TFEL functions to protect the light-emitting element layer EML from foreign substances such as dust. For example, the encapsulation film 190 may include a first inorganic film 191 disposed on the second electrode 174, an organic film 192 disposed on the first inorganic film, and a second inorganic film 193 disposed on the organic film. The first inorganic film 191 and the second inorganic film 193 may be formed as a silicon nitride layer, a silicon oxynitride layer, a silicon oxide layer, a titanium oxide layer, or an aluminum oxide layer, but the inventive concepts are not limited thereto. The organic film 192 may be made of acryl resin, epoxy resin, phenolic resin, polyamide resin, polyimide resin, or the like, but the inventive concepts are not limited thereto.

A touch sensor layer TSL is formed on the thin film encapsulation layer TFEL. The touch sensor layer TSL includes the driving electrodes TE, sensing electrodes RE, connecting electrodes BE, first driving lines TL1, second driving lines TL2, sensing lines RL, guard lines GL1, GL2, GL3, GL4, and GL5, and ground lines GRL1, GRL2, and GRL3. For convenience of description, only the driving electrodes TE of the touch sensor layer TSL are illustrated in FIGS. 6 and 7.

The driving electrodes TE are formed on the encapsulation film 190. In addition to the driving electrodes TE, the sensing electrodes RE, the first driving lines TL1, the second driving lines TL2, the sensing lines RL, the guard lines GL1, GL2, GL3, GL4, and GL5, and the ground lines GRL1, GRL2, and GRL3 may be disposed on the encapsulation film 190. That is, except for the connecting electrodes BE, the driving electrodes TE, the sensing electrodes RE, the first driving lines TL1, the second driving lines TL2, the sensing lines RL, the guard lines GL1, GL2, GL3, GL4, and GL5, and the ground lines GRL1, GRL2, and GRL3 may be disposed on the same layer and may be made of the same material.

Each of the driving electrodes TE may include a first metal layer ML1 and a second metal layer ML2. The first metal layers ML1 are formed on the encapsulation film 190. The first metal layers ML1 are disposed to overlap the pixel definition layer 180 and do not overlap the red subpixel R, the green subpixel G, and the blue subpixel B. The first metal layers ML1 may be formed to include a stacked structure (Ti/Al/Ti) of aluminum and titanium, a stacked structure (ITO/Al/ITO) of aluminum and ITO, an APC alloy, and a stacked structure (ITO/APC/ITO) of ITO and an APC alloy, but the inventive concepts are not limited thereto.

A first insulating film INS1 is formed on the first metal layers ML1. First contact holes CT1 may be formed in the first insulating layer INS1 to pass through the first insulating layer INS1 and expose the first metal layers ML1.

The second metal layers ML2 are formed on the first insulating layer INS1. The second metal layers ML2 are disposed to overlap the pixel definition layer 180 and do not overlap the red subpixel R, the green subpixel G, and the blue subpixel B. The second metal layers ML2 may be connected to the first metal layer ML1 through the first contact holes CT1. The second metal layer ML2 may be made of the same material as the first metal layer ML1. For example, the second metal layers ML2 may be formed to include a stacked structure (Ti/Al/Ti) of aluminum and titanium, a stacked structure (ITO/Al/ITO) of aluminum and ITO, an APC alloy, and a stacked structure (ITO/APC/ITO) of ITO and an APC alloy, but the inventive concepts are not limited thereto.

A second insulating film INS2 is formed on the second metal layers ML2. Second contact holes CT2 may be formed in the second insulating layer INS2 to pass through the second insulating layer INS2 and expose the second metal layers ML2.

A third insulating film INS3 is formed on the second insulating film INS2. The first insulating film INS1 and the second insulating film INS2 may be formed as an inorganic film, for example, a silicon nitride layer, a silicon oxynitride layer, a silicon oxide layer, a titanium oxide layer, or an aluminum oxide layer.

According to the exemplary embodiment shown in FIGS. 6 and 7, since the touch electrodes TE and RE are formed directly on the encapsulation film 190, a thickness of a display device 10 may be decreased as compared with a case in which a separate touch panel including the touch sensor electrodes TE and RE is attached onto the encapsulation film 190.

In addition, according to the exemplary embodiment shown in FIGS. 6 and 7, the touch electrodes TE and RE may be formed as mesh-shaped electrodes and may also overlap the pixel definition layer 180. Thus, it is possible to prevent a reduction in an aperture region of the subpixels R, G, and B. Furthermore, it is possible to decrease a parasitic capacitance between the touch electrodes TE and RE and the second electrode 174.

In addition, according to the exemplary embodiment shown in FIGS. 6 and 7, since the touch electrodes TE and RE include the first metal layer ML1 and the second metal layer ML2, a thickness of the touch electrodes TE and RE may be increased. Thus, a resistance of the touch electrodes TE and RE may be lowered. Therefore, a speed at which mutual capacitance is charged by a driving signal may be increased without lowering a frequency of the driving signal, thereby increasing touch sensitivity.

Referring to FIGS. 6 and 9, the pits PIT may not be formed on the pixel definition layer 180. The pits PIT may be formed to have the same length as each side of adjacent subpixels R, G, and B. Since the pit PIT is formed to be spaced apart from each of the subpixels R, G, and B by a certain distance, the pit PIT may not be formed in a region adjacent to each vertex of the subpixels.

The common organic layer 172 may form a common layer on the first electrode 171 and the pixel definition layer 180. The organic light-emitting layer 173 may be independently stacked on the common organic layer 172 for each of the subpixels R, G, and B. The second electrode 174 may form a common layer on the common organic layer 172 and the organic light-emitting layer 173. That is, since the pits PIT are not provided on the pixel definition layer 180, the common organic layer 172 and the second electrode 174 may be formed without being separated between the adjacent subpixels R, G, and B, and electrons may be moved through such a region.

Figure 10A:
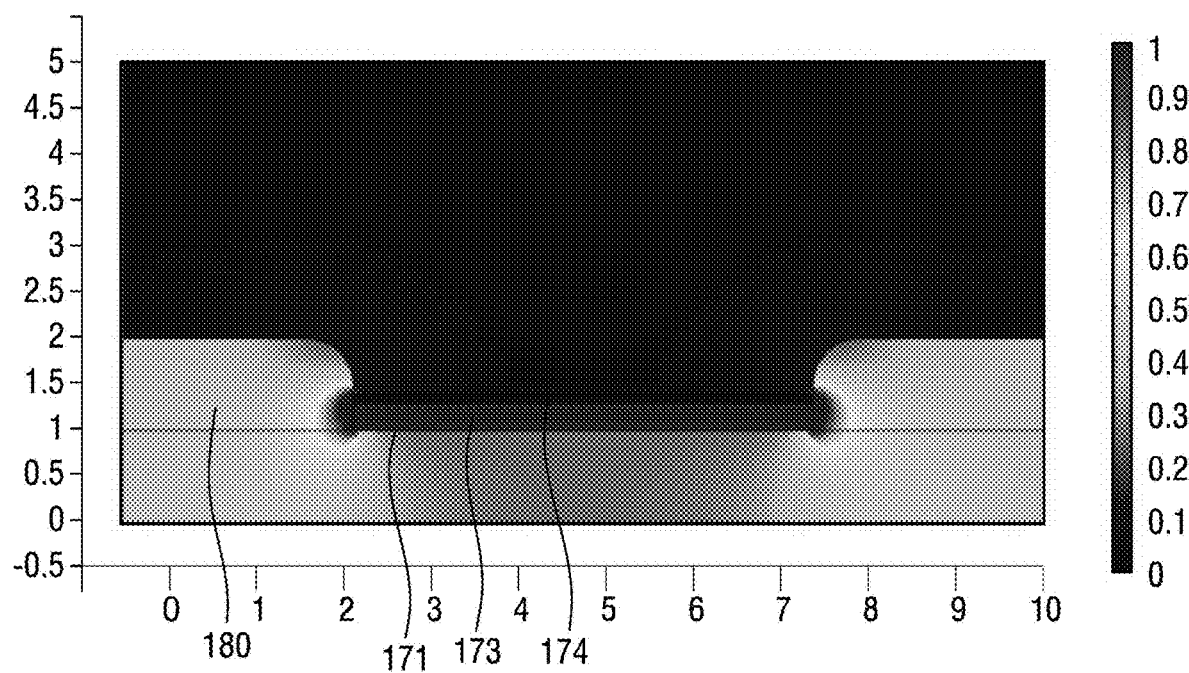
FIGS. 10A and 10B are graphs showing a change in electric field according to the presence or absence of a pit.
Figure 10B:
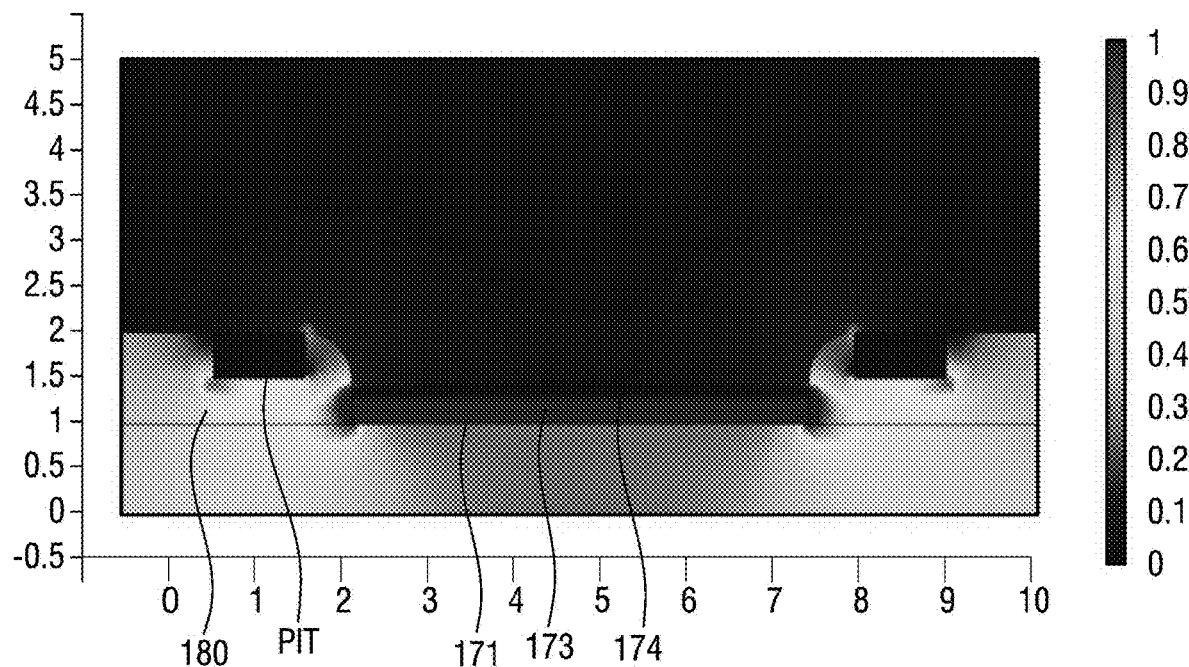

FIGS. 10A and 10B are graphs showing a change in electric field according to the presence or absence of a pit. In the graph, the area in red indicates the highest electric field intensity, and the area in blue indicates the lowest electric field intensity.

Referring to FIGS. 10A and 10B, whether the pits PIT are present on the pixel definition layer 180, the highest electric field may be formed in a region in which the organic light-emitting layer 173 is formed. On the other hand, when the pits PIT are not present on the pixel definition layer 180, an electric field having a certain level or more may be formed on an entire surface of the pixel definition layer 180. In this case, an electric field higher than that of the pixel definition layer 180 may be formed in the region in which the organic light-emitting layer 173 is formed. On the contrary, when the pits PIT are present on the pixel definition layer 180, an electric field may be barely formed in regions in which the pits PIT are formed.

That is, since holes may be accelerated or sustained by an electric field across both ends of the first electrode 171 and the second electrode 174, when pits PIT are provided on the pixel definition layer 180, the number of holes moved to adjacent subpixels R, G, and B may be decreased.

Figure 11A:
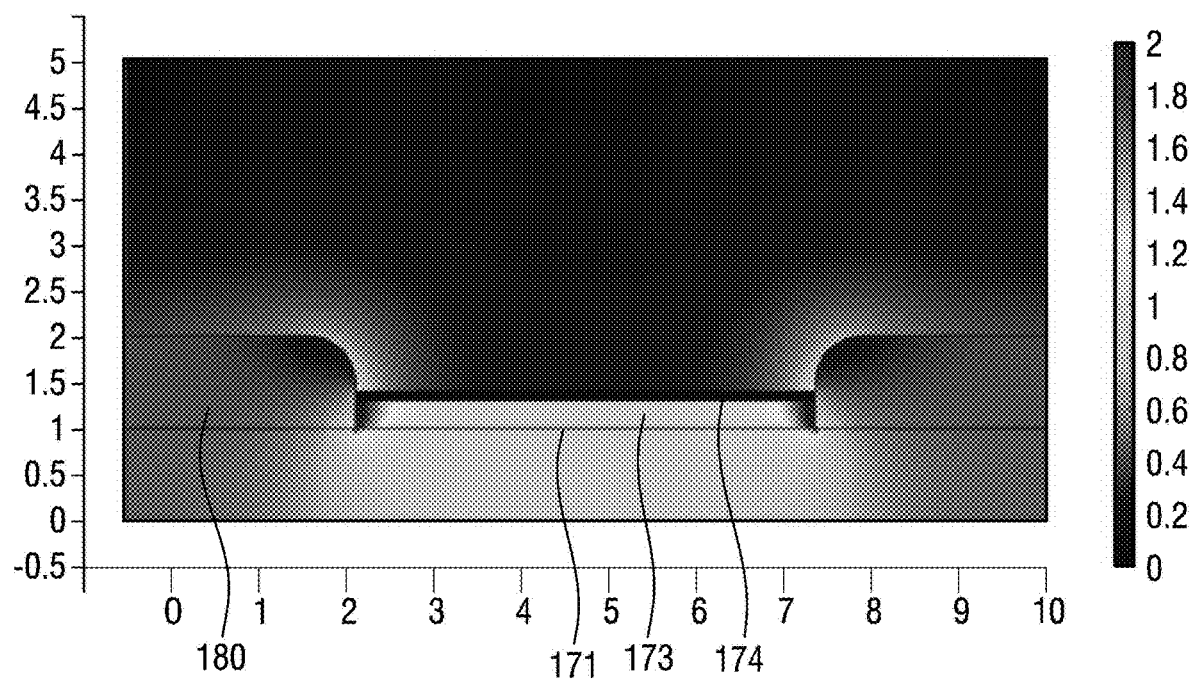
FIGS. 11A and 11B are graphs showing a change in current density according to the presence or absence of a pit.
Figure 11B:
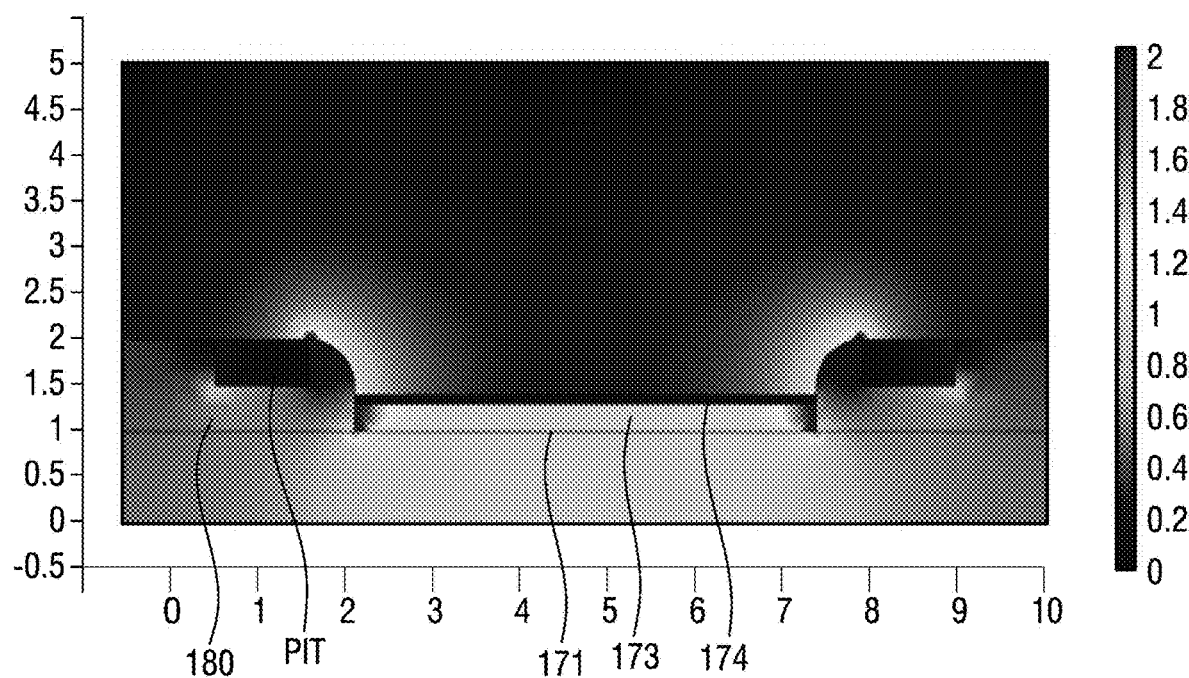

FIGS. 11A and 11B are graphs showing a change in current density according to the presence or absence of a pit. In the graph, the area in red indicates the highest current density, and the area in blue indicates the lowest current density.

Referring to FIGS. 11A and 11B, irrespective of whether the pits PIT are present on the pixel definition layer 180, current density may be greatest in the region in which the organic light-emitting layer 173 is formed. On the other hand, when the pits PIT are not present on the pixel definition layer 180, current density having a certain level or more may be formed on the entire surface of the pixel definition layer 180. In this case, current density in the region in which the organic light-emitting layer 173 is formed may be greater than that in an upper region of the pixel definition layer 180. On the contrary, when the pits PIT are present on the pixel definition layer 180, current density may be close to zero in the regions in which the pits PIT are formed.

That is, holes may not be moved to adjacent subpixels R, G, and B due to the pits PIT formed on the pixel definition layer 180 and may remain in regions between the pits PIT and the organic light-emitting layer 173, thereby decreasing the number of the holes which are moved to the adjacent subpixels R, G, and B.

Hereinafter, other exemplary embodiments will be described. In the following exemplary embodiments, description of the same configuration as that of the previously described exemplary embodiment will be omitted or simplified, and differences will be mainly described.

Figure 12A:
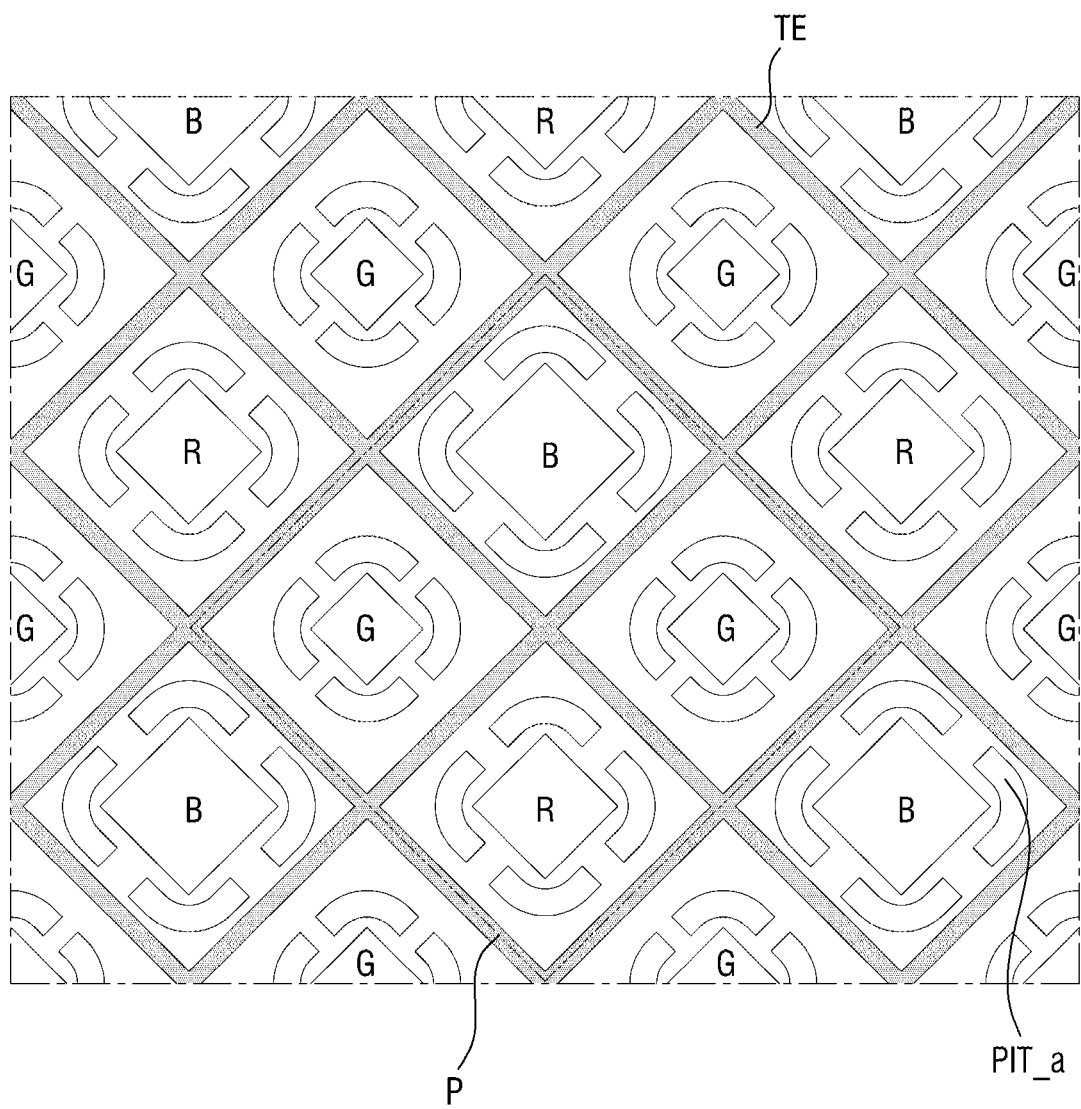
FIGS. 12A and 12B are views illustrating a modified exemplary embodiment of a planar shape of a pit.
Figure 12B:
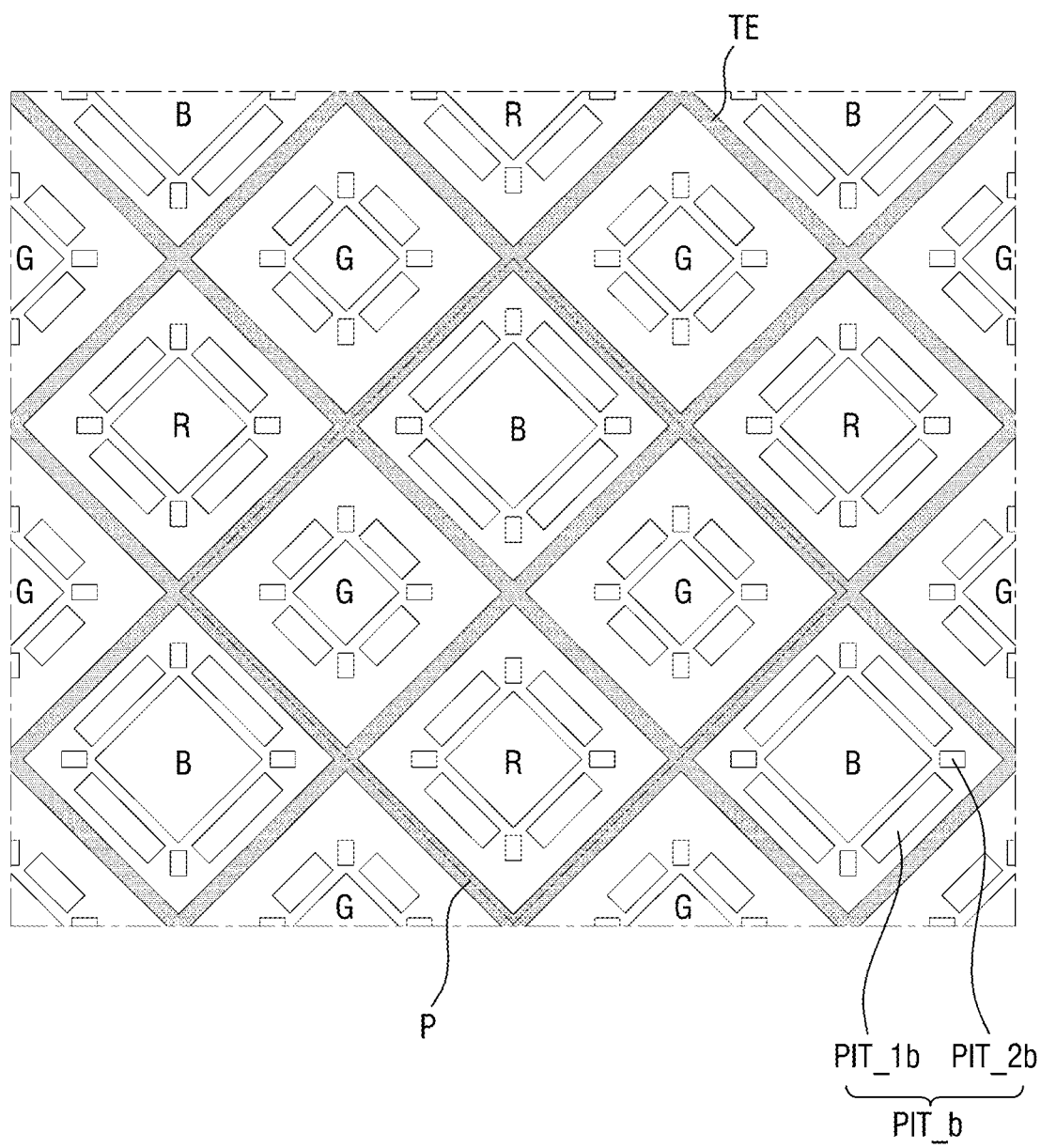

FIGS. 12A and 12B are views illustrating a modified exemplary embodiment of a planar shape of a pit.

Referring to FIG. 12A, a pit PIT_a is different from the pit PIT having a rectangular shape shown in FIG. 6 in that the pit PIT_a has a polygonal shape with a curved surface curved along an edge of each of subpixels R, G, and B.

More specifically, the pits PIT_a may be disposed to partially surround each of the subpixels R, G, and B. For example, when the pit PIT_a is disposed along a region near each vertex of a subpixel having a rectangular shape, a transport path of holes moved to adjacent subpixels through the common organic layer 172 or the second electrode 174 may be increased.

Referring to FIG. 12B, a configuration of FIG. 12B is different from the configuration in which the pit PIT is disposed at each side of the subpixel shown in FIG. 6 in that a pit PIT_b is additionally disposed in a region near each vertex of the subpixels R, G, and B.

More specifically, pits PIT_b may be disposed to surround each of the subpixels R, G, and B. For example, separate pits PIT_b may be disposed in regions near each side and each vertex of a subpixel having a rectangular shape, a total of eight pits PIT_b may be disposed in one subpixel. In this case, a size of a pit PIT_2b disposed in the region near the vertex may be smaller than a size of a pit PIT_1b disposed in the region near each side of the subpixel. As the number of the pits PIT_b surrounding one subpixel is increased, it is possible to decrease an amount of holes moved to adjacent subpixels through the common organic layer 172 or the second electrode 174.

Figure 13A:
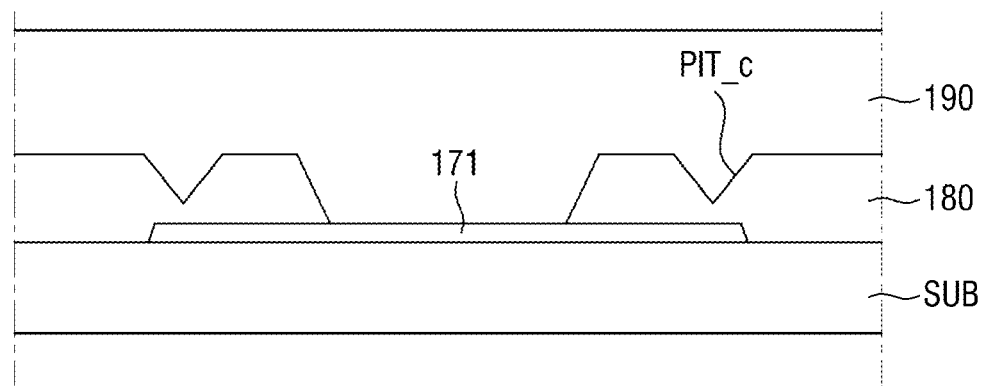
FIGS. 13A and 13B are views illustrating a modified exemplary embodiment of a sectional shape of a pit.
Figure 13B:
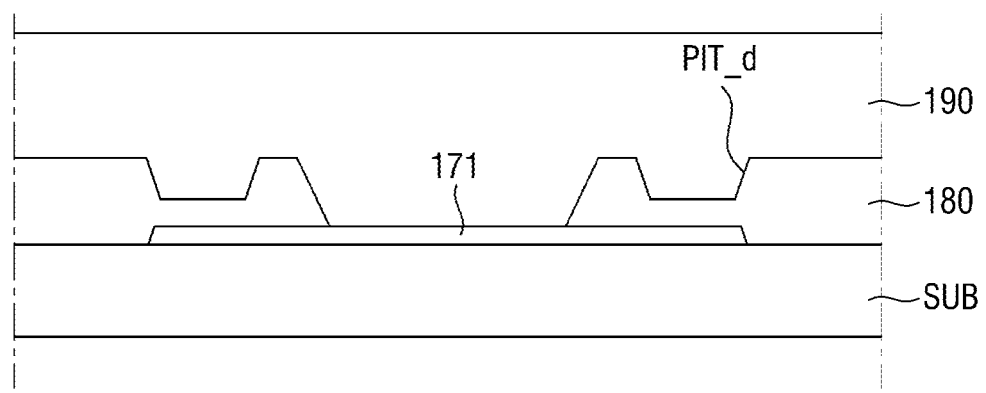

FIGS. 13A and 13B are views illustrating a modified exemplary embodiment of a sectional shape of a pit.

Referring to FIGS. 13A and 13B, a pit PIT-c is different from the pit having a cross section with a rectangular shape shown in FIG. 7 in that a sectional shape of the pit PIT_c is an inverted triangular or inverted trapezoidal shape.

More specifically, referring to FIGS. 7 and 13A, since the pit PIT_c having the nverted triangular shape has no flat surface, the pit PIT_c may be easily disposed even when a width of the pixel definition layer 180 is relatively small. Further, since the common organic layer 172 and the second electrode 174 are barely stacked on a flat surface, it is possible to effectively prevent holes from being moved through the common organic layer 172 and the second electrode 174.

Referring to FIG. 13B, a side surface of the pit PIT_d having the inverted trapezoidal shape may have an inclination angle greater than 50° and less than 90°. As described above, an organic layer may be formed through a deposition process or a solution process, and when an angle of the side surface PIT_S of the pit PIT is greater than 50°, the common organic layer 172 may be substantially separated. Therefore, a case in which an angle formed between the side surface of the pit PIT and a planar portion is designed to be greater than 50° and less than 90° may be advantageous in terms of a manufacturing process as compared with a case in which an angle formed between the side surface of the pit PIT and the planar portion is 90°.

Figure 14:
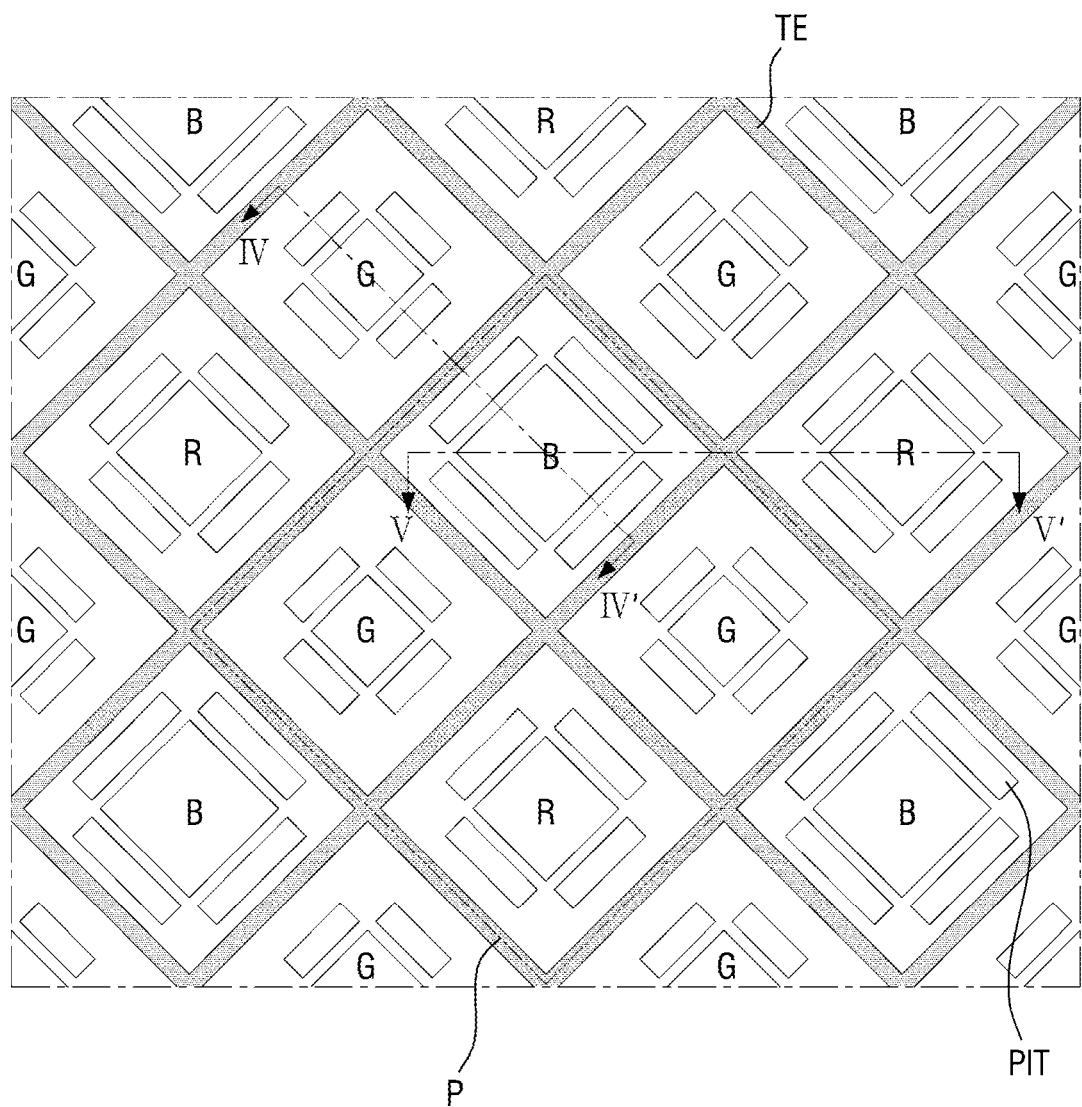
FIG. 14 is an enlarged plan view illustrating another exemplary embodiment of region B of FIG. 5.
Figure 15:
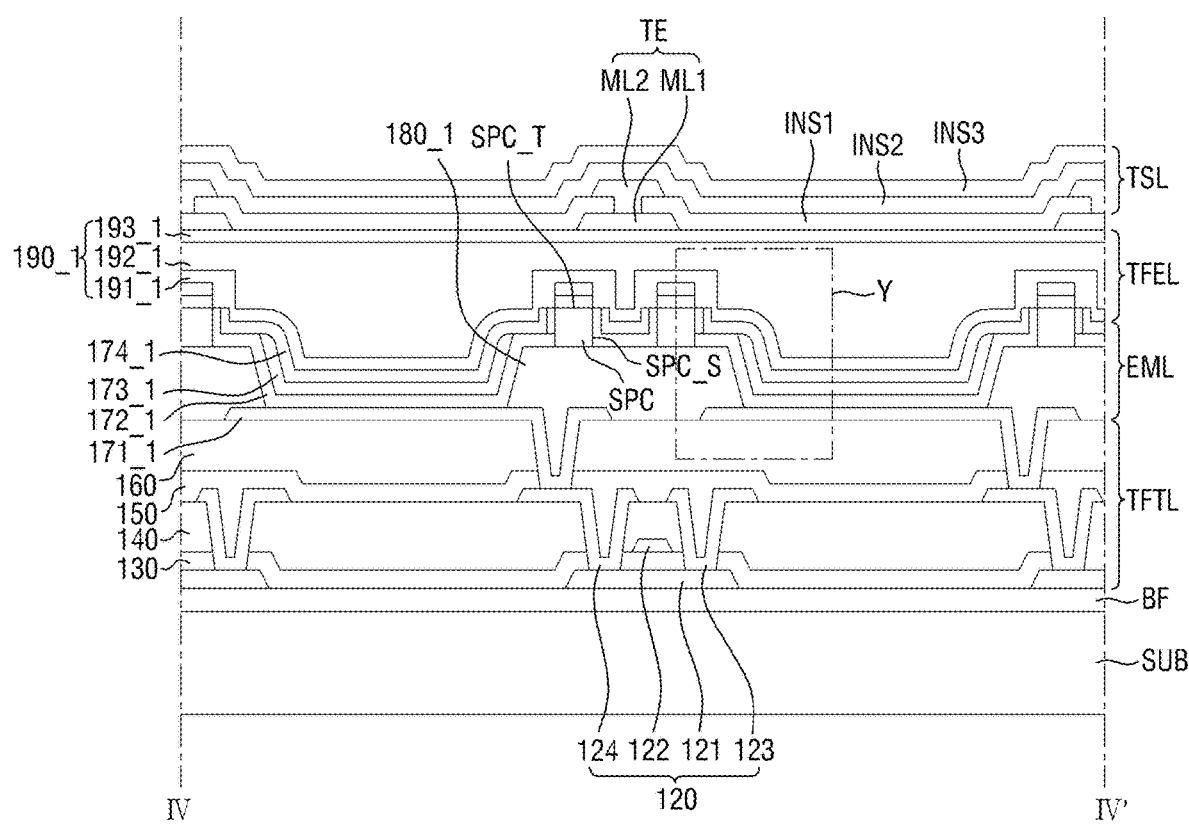
FIG. 15 is a cross-sectional view of an exemplary embodiment which is taken along line IV-IV' of FIG. 14.
Figure 16:
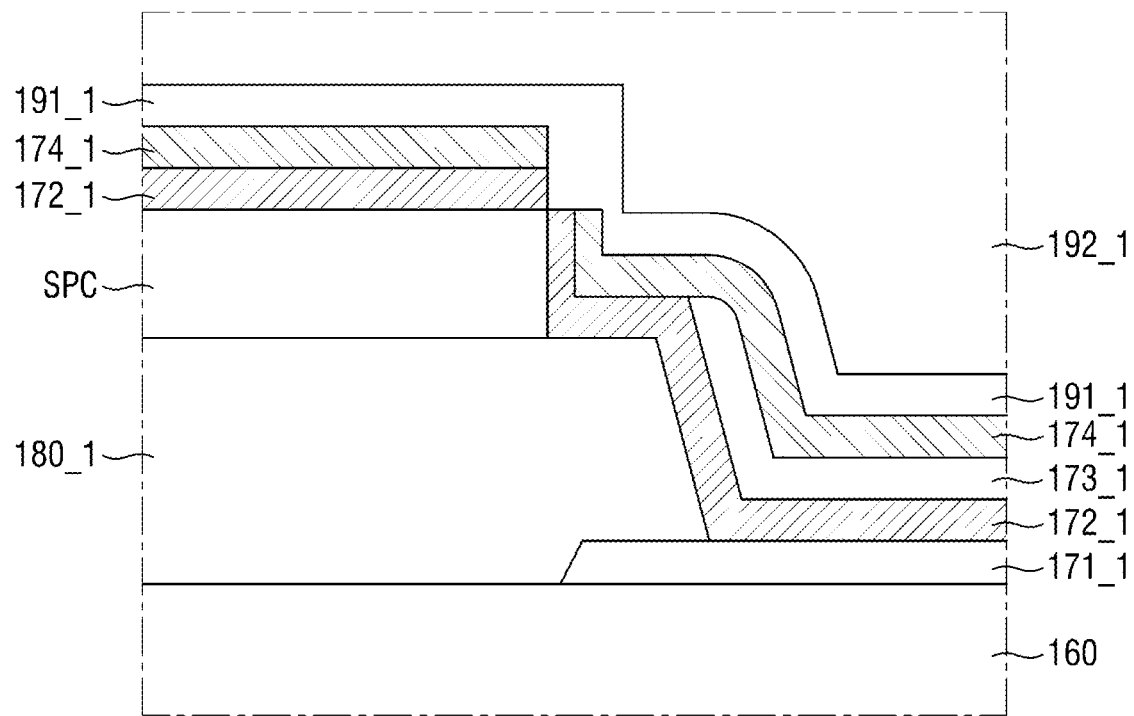
FIG. 16 is an enlarged view illustrating portion Y of FIG. 15.

FIG. 14 is an enlarged plan view illustrating another exemplary embodiment of region B of FIG. 5. FIG. 15 is a cross-sectional view of an exemplary embodiment which is taken along line IV-IV' of FIG. 14. FIG. 16 is an enlarged view illustrating portion Y of FIG. 15.

A configuration of FIGS. 14 to 16 is different from the configuration in which the pair of pits PIT are disposed on the pixel definition layer 180 shown in FIGS. 6 to 8 in that a pair of spacers SPC are provided on a pixel definition layer 180_1.

More specifically, light-emitting elements 170_1 and the pixel definition layer 180_1 are formed on a planarizing film 160. Each of the light-emitting elements 170_1 may include a first electrode 171_1, a common organic layer 172_1, an organic light-emitting layer 173_1, and a second electrode 174_1.

The first electrode 171_1 may be formed on the planarizing film 160. The first electrode 171_1 is connected to a drain electrode 124 of a thin film transistor 120 through a contact hole passing through a protective film 150 and the planarizing film 160.

The pixel definition layer 180_1 may be formed to partition the first electrode 171_1 on the planarizing film 160 to function as a pixel definition layer for defining subpixels R, G, and B. The pixel definition layer 180_1 may be formed to cover an edge of the first electrode 171_1. The pixel definition layer 180_1 may be formed as an organic film made of acryl resin, epoxy resin, phenolic resin, polyamide resin, polyimide resin, or the like.

The pair of spacers SPC may be formed to protrude from the pixel definition layer 180_1.

Referring to FIG. 14, the spacers SPC may be disposed to surround each of the subpixels R, G, and B. According to an exemplary embodiment, a separate spacer SPC may be disposed on each side of a subpixel having a rectangular shape, and one subpixel may include a total of four spacers SPC. Thus, two spacers SPC may be disposed between adjacent two pixels of the subpixels R, G, and B.

The spacer SPC may be formed to have the same length as each side of adjacent subpixels R, G, and B. Since the spacer SPC is formed to be spaced apart from each of the subpixels R, G, and B by a certain distance, the spacer SPC may not be formed in a region adjacent to each vertex of the subpixels.

In FIG. 14, it has been described that four spacers SPC are included in every one subpixel R, G, or B and a shape of the spacers SPC is a rectangular shape, but the inventive concepts are not limited thereto. The number and shape of the spacers SPC formed every one subpixel R, G, or B may be variously modified. This will be described in detail with reference to FIGS. 17A to 17C.

Referring to FIG. 15, the pair of spacers SPC may be formed on the pixel definition layer 180_1. According to an exemplary embodiment, the spacer SPC may have an upper surface SPC_T formed parallel to the planarizing film 160 and a side surface SPC_S extending in a direction perpendicular to the planarizing film 160. At least a portion of the upper surface SPC_T may overlap a driving electrode TE in a thickness direction thereof. A height of the side surface SPC_S may correspond to about half a height of the pixel definition layer 180_1, but the inventive concepts are not limited thereto.

Each of the subpixels R, G, and B refers to a region in which the first electrode 171_1, the common organic layer 172_1, the organic light-emitting layer 173_1, and the second electrode 174_1 are sequentially stacked and holes from the first electrode 171_1 and electrons from the second electrode 174_1 are combined with each other in the organic light-emitting layer 173 to emit light.

The common organic layer 172_1 is formed on the first electrode 171_1 and the pixel definition layer 180_1. The common organic layer 172_1 may be a common layer commonly formed on the first electrode 171_1 and the pixel definition layer 180_1 and may include a hole injection layer and a hole transporting layer. Since a p-type dopant having high conductivity is used in the hole injection layer, the hole injection layer may be a major cause of a lateral leakage current.

The common organic layer 172_1 may be formed through a deposition process or a solution process. When the common organic layer 172_1 is formed through the deposition process, the common organic layer 172_1 may be formed through an evaporation deposition method. A film formed through the evaporation deposition method has low step coverage characteristics. Accordingly, when an angle of a side surface SPC_S of the spacer SPC is greater than about 50°, a thickness of the common organic layer 172_1 on the side surface SPC_S of the spacer SPC may be less than a thickness of the common organic layer 172_1 on an inclined surface of the pixel definition layer 180_1.

For example, when the angle of the side surface SPC_S of the spacer SPC protruding from the pixel definition layer 180_1 is 90°, the common organic layer 172_1 stacked on an upper surface of the pixel definition layer 180_1 may be separated from the common organic layer 172_1 stacked on the side surface SPC_S of the spacer SPC.

When the common organic layer 172_1 is formed as a common layer in adjacent subpixels R, G, and B, the common organic layer 172_1 may become a transport path of holes. As shown in FIG. 15, when the common organic layer 172_1 is formed so as to be separated on the upper surface of the pixel definition layer 180_1 and the side surface SPC_S of the spacer SPC, a transport path of holes of the blue subpixel B may be cut off, and thus, it may be difficult to move holes of the blue subpixel B to the green subpixel G. That is, a leakage path of a current may be minimized due to the spacer SPC, thereby minimizing the adjacent pixel being influenced due to a leakage current through the common organic layer 172_1. The organic light-emitting layer 173_1 may be formed on the common organic layer 172_1. Unlike the common organic layer 172_1, the organic light-emitting layer 173_1 may be formed for each of the subpixels R, G, and B. The organic light-emitting layer 173_1 may include an organic material to emit a certain color. In this case, the organic light-emitting layer 173_1 of the red subpixel R may emit red light, the organic light-emitting layer 173_1 of the green subpixel G may emit green light, and the organic light-emitting layer 173_1 of the blue subpixel B may emit blue light. Alternatively, the organic light-emitting layers 173_1 of the subpixels R, G, and B may emit white light. In this case, the red subpixel R may further include a red color filter layer, the green subpixel G may further include a green color filter layer, and the blue subpixel B may further include a blue color filter layer.

The second electrode 174_1 is formed on the common organic layer 172_1 and the organic light-emitting layer 173_1. The second electrode 174_1 may be formed to cover the common organic layer 172_1 and the organic light-emitting layer 173_1. The second electrode 174_1 may be a common layer commonly formed in the pixels P. Since holes may be moved through the second electrode 174_1, when the second electrode 174_1 connects adjacent pixels, the second electrode 174_1 may be another cause of a lateral leakage current. A capping layer may be formed on the second electrode 174_1.

The second electrode 174_1 includes a metal as a component thereof, and the metal has characteristics of being randomly deposited due to diffuse reflection characteristics of particles thereof as compared with an organic material. Thus, the second electrode 174_1 has excellent coverage characteristics. However, when the angle of the side surface SPC_S of the spacer SPC protruding from the pixel definition layer 180_1 is 90°, the second electrode 174_1 stacked on the upper surface of the pixel definition layer 180_1 may be separated from the second electrode 174_1 stacked on the side surface SPC_S of the spacer SPC.

When the second electrode 174_1 is commonly formed between adjacent subpixels R, G, and B, the second electrode 174_1 may become a transport path of holes. As shown in FIG. 16, when the second electrode 174_1 is formed to be separated on the upper surface of the pixel definition layer 180_1 and the side surface SPC_S of the spacer SPC, a path may be cut off along which holes of the blue subpixel B are able to detour. Thus, it may be difficult to move the holes to an adjacent green subpixel G. That is, a leakage path of a current may be minimized due to the spacer SPC, thereby minimizing the adjacent pixel being influenced due to a leakage current through the second electrode 174_1.

Referring to FIGS. 14 and 15, the spacer SPC may not be formed in a partial region of the pixel definition layer 180_1.

For example, it is possible to move holes and electrons along line V-V' of FIG. 14. The spacer SPC may be formed to have the same length as each side of adjacent subpixels R, G, and B. Since the spacer SPC is formed to be spaced apart from each of the subpixels R, G, and B by a certain distance, the spacer SPC may not be formed in a region adjacent to each vertex of the subpixels.

The common organic layer 172_1 may form a common layer on the first electrode 171_1 and the pixel definition layer 180_1. The organic light-emitting layer 173_1 may be independently stacked on the common organic layer 172_1 for each of the subpixels R, G, and B. The second electrode 174_1 may form a common layer on the common organic layer 172_1 and the organic light-emitting layer 173_1. That is, since the spacers SPC are not provided on the pixel definition layer 180_1, the common organic layer 172_1 and the second electrode 174_1 may be formed without being separated between the adjacent subpixels R, G, and B, and electrons may be moved through such a region.

Figure 17A:
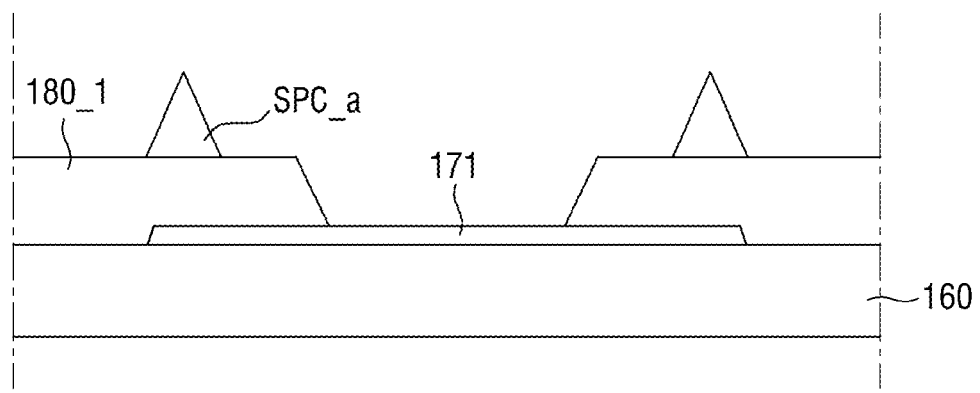
FIGS. 17A, 17B, and 17C are views illustrating a modified exemplary embodiment of a sectional shape of a spacer.
Figure 17B:
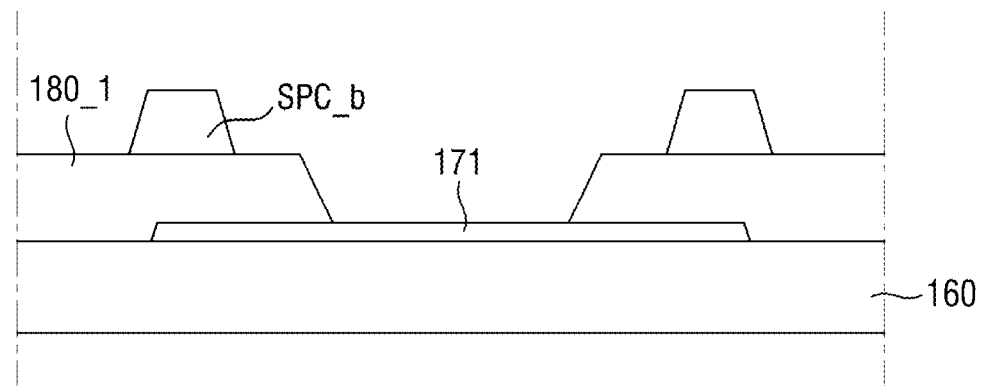
Figure 17C:
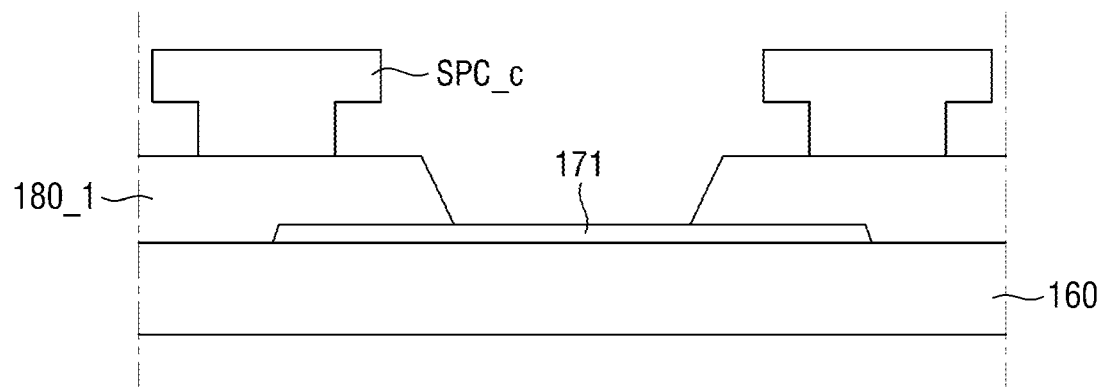

FIGS. 17A to 17C are views illustrating a modified exemplary embodiment of a sectional shape of a spacer.

Referring to FIGS. 15 and 17A to 17C, spacers SPC_a, SPC_b, and SPC_c are different from the spacer SPC having a cross section with a rectangular shape shown in FIG. 15 in that a sectional shape of the spacers SPC_a, SPC_b, and SPC_c is a triangular, trapezoidal, or hammer shape.

More specifically, referring to FIG. 17A, since the spacer SPC_a having the triangular shape has no upper surface, the spacer SPC_a having the triangular shape may be easily disposed even when a width of the pixel definition layer 180_1 is relatively small. Furthermore, since the common organic layer 172_1 and the second electrode 174_1 are barely stacked on an upper surface of the spacer SPC_a, it is possible to effectively prevent holes from being moved through the common organic layer 172_1 and the second electrode 174_1.

Referring to FIG. 17B, a side surface of the spacer SPC_b having the trapezoidal shape may have an inclination angle greater than 50° and less than 90°. As described above, an organic layer may be formed through a deposition process or a solution process, and when an angle of a side surface SPC_S of the spacer SPC_b is greater than about 50°, the common organic layer 172_1 may be substantially separated. Therefore, a case in which an angle formed between the side surface of the spacer SPC_b and the pixel definition layer 180_1 is designed to be greater than 50° and less than 90° may be advantageous in terms of a manufacturing process as compared with a case in which an angle formed between the side surface of the spacer SPC_b and the pixel definition layer 180_1 is 90° as shown in FIG. 15.

Referring to FIG. 17C, a diameter of an upper portion of the SPC_c having the hammer shape may be greater than a diameter of a lower portion thereof. As a difference between the diameter of the upper portion and the diameter of the lower portion of the spacer SPC_c is increased, a portion at which the common organic layer 172_1 is not deposited may be formed. Since the common organic layer 172_1, which is deposited after the spacer SPC_c is formed, has a strong linearity during deposition, a flat portion thereof is well deposited, but when a side portion thereof, particularly, a lower portion thereof, meets a structure in which a lower portion thereof has a diameter less than that of an upper portion thereof, the common organic layer 172_1 may not be deposited at the side portion thereof, or a separation portion, in which the common organic layer 172_1 is partially separated, may be formed. Meanwhile, the second electrode 174_1 disposed on the common organic layer 172_1 and the organic light-emitting layer 173_1 includes a metal as a component thereof, and the metal has characteristics of being randomly deposited due to diffuse reflection characteristics of particles thereof as compared with an organic material. Thus, the second electrode 174_1 has excellent coverage characteristics. However, when the second electrode 174_1 meets the spacer SPC_c having the hammer shape, the second electrode 174_1 tends not to be deposited as a gap between the upper portion and the lower portion of the spacer SPC_c is increased.

Figure 18:
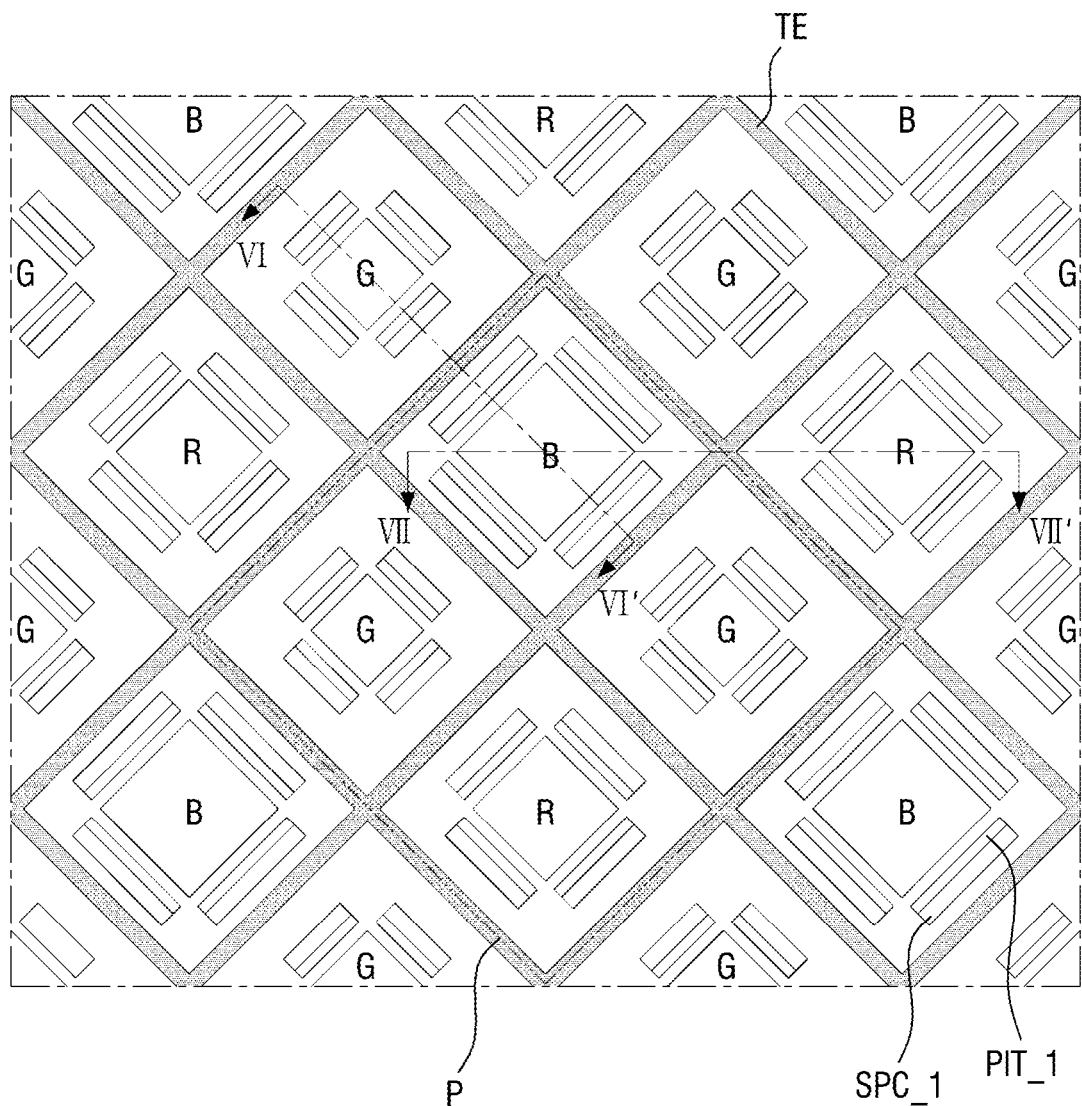
FIG. 18 is an enlarged plan view illustrating still another exemplary embodiment of area B of FIG. 5.
Figure 19:
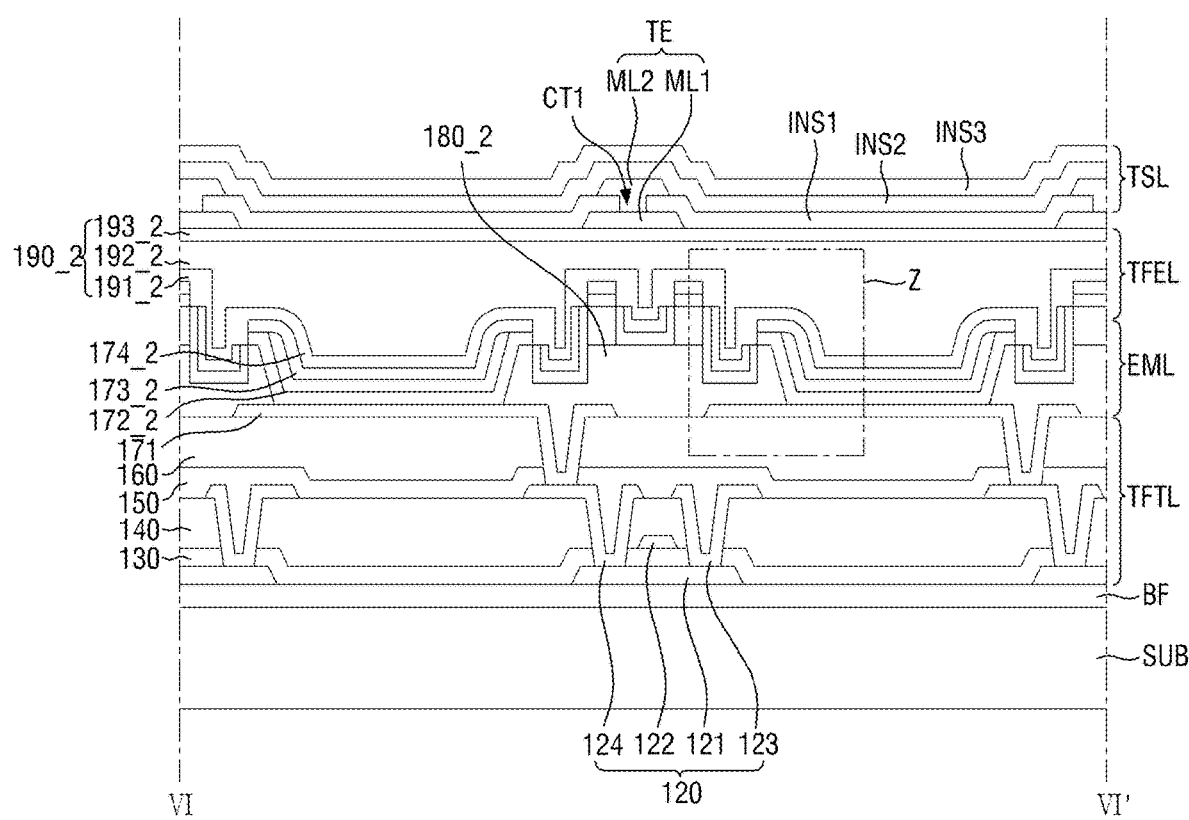
FIG. 19 is a cross-sectional view of an exemplary embodiment which is taken along line VI-VI' of FIG. 18.
Figure 20:
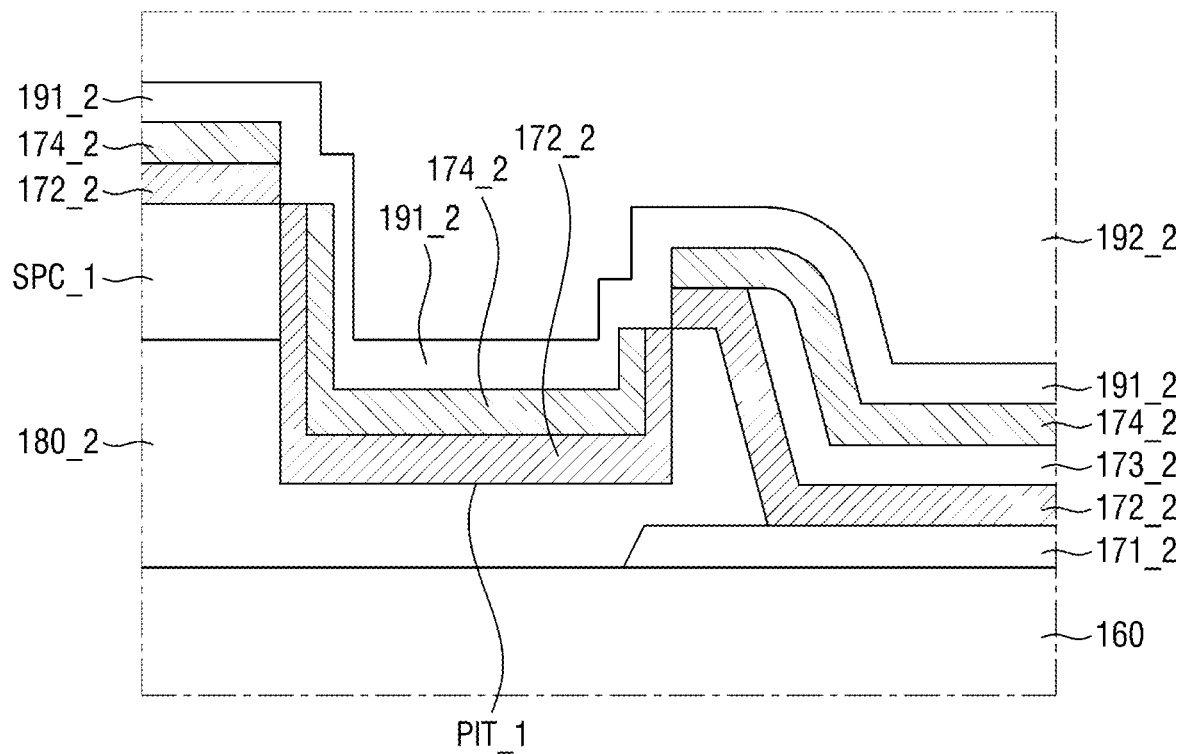
FIG. 20 is an enlarged view illustrating portion Z of FIG. 19.

FIG. 18 is an enlarged plan view illustrating still another example of area B of FIG. 5. FIG. 19 is a cross-sectional view of an example which is taken along line VI-VI' of FIG. 18. FIG. 20 is an enlarged view illustrating portion Z of FIG. 19.

A configuration of FIGS. 18 to 20 is different from the configuration in which only the pair of pits PIT are disposed on the pixel definition layer 180 shown in FIGS. 6 to 8 and a configuration in which only the pair of spacers SPC are disposed on the pixel definition layer 180_1 in that a pair of pits PIT_1 and a pair of spacers SPC_1 are provided on a pixel definition layer 180_2.

More specifically, light-emitting elements 170_2 and the pixel definition layer 180_2 are formed on a planarizing film 160. Each of the light-emitting elements 170_2 may include a first electrode 171_2, a common organic layer 172_2, an organic light-emitting layer 173_2, and a second electrode 174_2.

The first electrode 171_2 may be formed on the planarizing film 160. The first electrode 171_2 is connected to a drain electrode 124 of a thin film transistor 120 through a contact hole passing through a protective film 150 and the planarizing film 160.

The pixel definition layer 180_2 may be formed to partition the first electrode 171_2 on the planarizing film 160 to function as a pixel definition layer for defining subpixels R, G, and B. The pixel definition layer 180_2 may be formed to cover an edge of the first electrode 171_2. The pixel definition layer 180_2 may be formed as an organic film made of acryl resin, epoxy resin, phenolic resin, polyamide resin, polyimide resin, or the like.

The pair of pits PIT_1 which are recessed and the pair of spacers SPC_1 which protrude may be consecutively formed on the pixel definition layer 180_2.

Referring to FIG. 18, the pits PIT_1 and the spacers SPC_1 may be disposed to surround each of the sub-pixels R, G, and B. According to an exemplary embodiment, a separate PIT and a separate spacer SPC_1 may be disposed in each side of a subpixel having a rectangular shape, and a total of four pits PIT and a total of four spacers SPC_1 may be included in one subpixel. As a result, two pits PIT_1 and two spacers SPC_1 may be disposed between the adjacent two subpixels of the subpixels R, G, and B.

The pit PIT_1 and the spacer SPC_1 may be formed to have the same length as each side of adjacent subpixels R, G, and B. Since the pit PIT_1 and the spacer SPC_1 are formed to be spaced apart from each of the subpixels R, G, and B by a certain distance, the pit PIT and the spacer SPC_1 may not be formed in a region adjacent to each vertex of the subpixels.

As shown in FIG. 18, an area of the pit PIT_1 may be smaller than an area of the spacer SPC_1. However, the inventive concepts are not limited to this, and the area of the pit PIT_1 and the spacer SPC_1 may be variously applied according to the arrangement and size of the pixel definition layer 180_2.

In FIG. 18, it has been described that four pits PIT_1 and four spacers SPC_1 are included in every one subpixel R, G, or B, and a shape of the pit PIT_1 and the spacer SPC_1 is a rectangular shape, but the inventive concepts are not limited thereto. The number and shape of the pits PIT_1 and the spacers SPC_1 in every one subpixel R, G, or B may be variously modified and applied.

Referring to FIG. 19, the pair of pits PIT_1 and the pair of spacers SPC_1 may be consecutively formed on the pixel definition layer 180_2. According to an exemplary embodiment, the pit PIT_1 may have a flat surface PIT_1B formed parallel to the planarizing film 160 and a side surface PIT_1S extending in a direction perpendicular to the planarizing film 160. The spacer SPC_1 may have an upper surface SPC_1B formed parallel to the planarizing film 160 and a side surface SPC_1S extending in the direction perpendicular to the planarizing film 160. In this case, one side of the side surface PIT_1S of the pit PIT_1 and one side of the side surface SPC_1S of the spacer SPC_1 may be aligned to form one side surface. At least a portion of the flat surface PIT_1B of the pit PIT_1 and/or the upper surface SPC_1B of the spacer SPC_1 may overlap a driving electrode TE in a thickness direction thereof. A height of the side surface PIT_1S of the pit PIT_1 and the side surface SPC_1S of the spacer SPC_1 may correspond to about half a height of the pixel definition layer 180_2, but the inventive concepts are not limited thereto.

Each of the subpixels R, G, and B refers to a region in which the first electrode 171_2, the common organic layer 172_2, the organic light-emitting layer 173_2, and the second electrode 174_2 are sequentially stacked and holes from the first electrode 171_2 and electrons from the second electrode 174_2 are combined with each other in the organic light-emitting layer 173_2 to emit light.

The common organic layer 172_2 is formed on the first electrode 171_2 and the pixel definition layer 180_2. The common organic layer 172_2 may be a common layer commonly formed on the first electrode 171_2 and the pixel definition layer 180_2 and may include a hole injection layer and a hole transporting layer. Since a p-type dopant having high conductivity is used in the hole injection layer, the hole injection layer may be a major cause of a lateral leakage current.

The common organic layer 172_2 may be formed through a deposition process or a solution process. When the common organic layer 172_2 is formed through the deposition process, the common organic layer 172_2 may be formed through an evaporation deposition method.

Referring to FIGS. 19 and 20, when the common organic layer 172_2 is separated once on an upper surface of the pixel definition layer 180_2 and a right side surface PIT_1S of the pit PIT_1 and is separated once again on a left side surface PIT_1S of the pit PIT_1 and the upper surface SPC_1B of the spacer SPC_1, a transport path of holes of the blue subpixel B is cut off, and thus, it may be more difficult to move the holes to an adjacent green subpixel G. That is, a leakage path of a current may be minimized due to the pit PIT_1 and the spacer SPC_1 which are consecutively formed, thereby minimizing the adjacent pixel being influenced due to a leakage current through the common organic layer 172_2.

The organic light-emitting layer 173_2 may be formed on the common organic layer 172_2. Unlike the common organic layer 172_2, the organic light-emitting layer 173_2 may be formed for each of the subpixels R, G, and B. The organic light-emitting layer 173_2 may include an organic material to emit a certain color. In this case, the organic light-emitting layer 173_2 of the red subpixel R may emit red light, the organic light-emitting layer 173_2 of the green subpixel G may emit green light, and the organic light-emitting layer 173_2 may emit blue light. Alternatively, the organic light-emitting layers 173_2 of the subpixels R, G, and B may emit white light. In this case, the red subpixel R may further include a red color filter layer, the green subpixel G may further include a green color filter layer, and the blue subpixel B may further include a blue color filter layer.

The second electrode 174_2 is formed on the common organic layer 172_2 and the organic light-emitting layer 173_2. The second electrode 174_2 may be formed to cover the common organic layer 172_2 and the organic light-emitting layer 173_2. The second electrode 174_2 may be a common layer commonly formed in the pixels P. Since holes may be moved through the second electrode 174_2, when the second electrode 174_2 connects adjacent pixels, the second electrode 174_2 may be another cause of a lateral leakage current. A capping layer may be formed on the second electrode 174_2.

The second electrode 174_2 includes a metal as a component thereof, and the metal has characteristics of being randomly deposited due to diffuse reflection characteristics of particles thereof as compared with an organic material. Thus, the second electrode 174_2 has excellent coverage characteristics. When the second electrode 174_2 is commonly formed in adjacent subpixels R, G, and B, the second electrode 174_2 may become a transport path of holes. As shown in FIGS. 19 and 20, when the common organic layer 172_2 is separated once on the upper surface of the pixel definition layer 180_2 and the right side surface PIT_1S of the pit PIT_1 and is separated once again on the left side surface PIT_1S of the pit PIT_1 and the upper surface SPC_1B of the spacer SPC_1, a path may be cut off along which holes of the blue subpixel B are able to detour. Thus, it may be more difficult to move the holes to an adjacent green subpixel G. That is, a leakage path of a current may be minimized due to the pit PIT_1 and the spacer SPC_1, thereby minimizing the adjacent pixel being influenced due to a leakage current through the common organic layer 172_4

Referring to FIGS. 18 and 19, the pit PIT_1 and the spacer SPC_1 may not be formed in a partial region of the pixel definition layer 180_2. For example, holes and electrons may be moved along line VII-VII' of FIG. 18. Specifically, the pit PIT_1 and the spacer SPC_1 may be formed to have the same length as each side of adjacent subpixels R, G, and B. Since the pit PIT_1 and the spacer SPC_1 are formed to be spaced apart from each of the subpixels R, G, and B by a certain distance, the pit PIT_1 and the spacer SPC_1 may not be formed in a region adjacent to each vertex of the subpixels.

Figure 21:
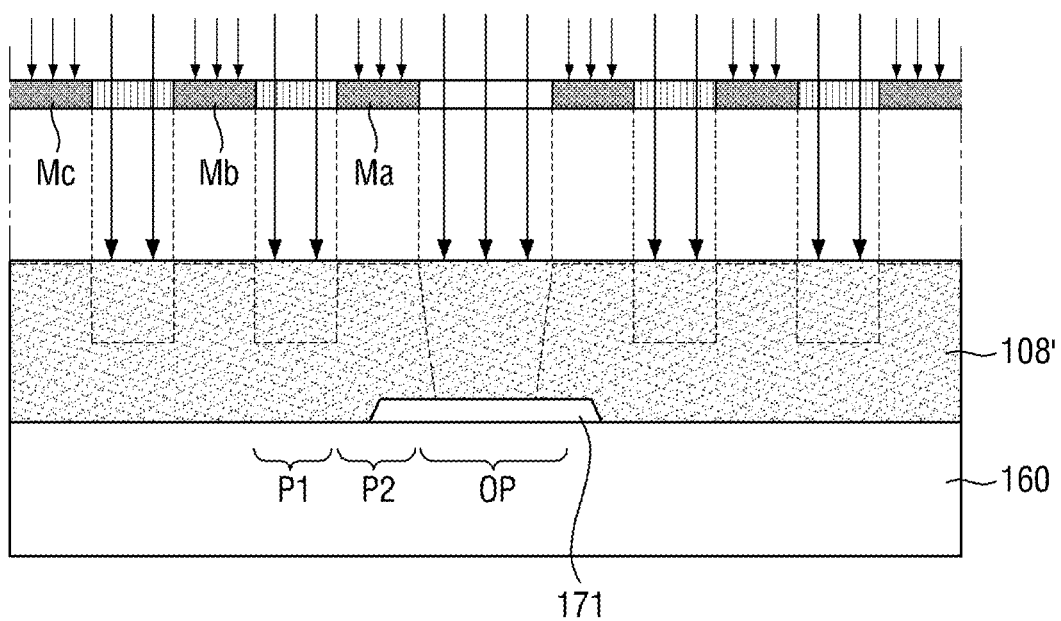
FIG. 21 is a view illustrating a process of manufacturing an organic light-emitting display device shown in FIG. 7.

FIG. 21 is a view illustrating a process of manufacturing an organic light-emitting display device shown in FIG. 7.

Referring to FIG. 21, process operations of a method of manufacturing the organic light-emitting display device according to an exemplary embodiment includes sequentially stacking organic layers 10 on a substrate SUB on which a first electrode 171 is formed and forming an organic film pattern which includes a first region P1 having a first thickness, a second region P2 having a second thickness greater than the first thickness, and an opening OP for exposing the first electrode 171.

Although not shown for convenience of description, the substrate SUB may include a buffer layer BF, an active layer 121 disposed on the buffer layer BF of a transistor region, a gate electrode 122 insulated from the active layer 121, a gate insulating film 130 configured to insulate the active layer 121 and the gate electrode 122, an interlayer insulating film 140 on the gate electrode 122, source/drain electrodes 123 and 124 insulated from the gate electrode 122 and electrically connected to the active layer 121 through a contact hole, a protective film 150 disposed on the source/drain electrodes 123 and 124, and a planarizing film 160. In addition, the first electrode 171 disposed on the planarizing film 160 is electrically connected to the drain electrode 124 through a contact hole.

As shown in FIG. 21, the photosensitive organic film 108 is formed on the first electrode 171 and the planarizing film 160. For example, the photosensitive organic film 108 may be made of at least one organic material selected from among benzocyclobutene (BCB), polyimide (PI), polyamide (PA), acrylic resin, and phenol resin.

Thereafter, a semi-transmissive exposure process (for example, using a halftone mask or a slit mask) is performed. Hereinafter, descriptions will be provided by exemplifying a case in which the photosensitive organic film 108 is formed using a photosensitive layer including a positive photosensitive material. However, the inventive concepts are not limited thereto, and in other exemplary embodiments, the photosensitive organic film 108 may also be formed using a negative photosensitive layer including a positive photosensitive material. In this case, a region from which the photosensitive organic film 108 is to be removed by the halftone mask SUB or the slit mask, a region in which the photosensitive organic film 108 remains and thus an upper surface of a pixel definition layer 180 is to be formed, and a region in which the photosensitive organic film 108 is removed and thus a pit PIT of the pixel definition layer 180 is to be formed are exposed to different extents That is, the halftone mask SUB or the slit mask includes a first light transmitting portion Ma configured to transmit 100% of light, a second light transmitting portion configured to transmit about half of light, and a third light transmitting portion Mc configured to barely transmit any light. Exposure is performed by disposing the halftone mask SUB or the slit such that the first light transmitting portion Ma corresponds to the region from which the photosensitive organic film 108 is to be removed, the second light transmitting portion Mb corresponds to the region in which approximately half of the photosensitive organic film 108 remains and thus the pit PIT is to be formed, and the third light scattering portion Mc corresponds to the region in which the photosensitive organic film 108 remains and thus the upper surface of the pixel definition layer 180 is to be formed.

Then, the photosensitive organic film 108 is removed through development from a portion of which 100% is exposed by the first light transmitting portion Ma, and thus, the first electrode 171 below the photosensitive organic film 108 is exposed. In addition, the photosensitive organic film 108 remains intact at a portion at which 100% of light is blocked by the third light transmitting portion Mc, and thus, the portion takes a shape of the upper surface of the pixel definition layer 180. About half of the photosensitive organic film 108 remains in a region of the second light transmitting portion Mb, through which about half of light passes, and thus, the pit PIT is formed.

Although not shown for convenience of description, referring to FIG. 7, the light-emitting element layer EML, the thin film encapsulation layer EML, and the touch sensor layer TSL may be sequentially formed on the first electrode 171 and the pixel definition layer 180 formed through such a process.

Figure 22:
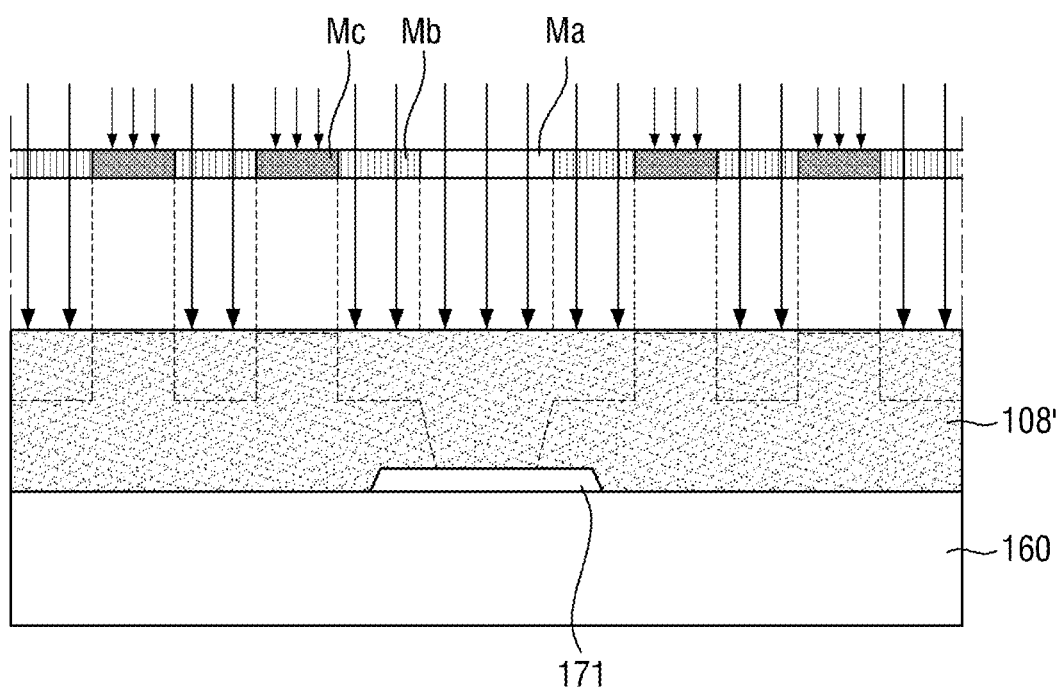
FIG. 22 is a view illustrating a process of manufacturing an organic light-emitting display device shown in FIG. 15.

FIG. 22 is a view illustrating a process of manufacturing an organic light-emitting display device shown in FIG. 15.

Referring to FIGS. 15 and 22, a configuration of FIGS. 15 and 22 is different from the configuration in which the pair of pits PIT are disposed on the pixel definition layer 180 shown in FIGS. 7 and 21 in that the pair of spacers SPC are provided on the pixel definition layer 180_1.

Specifically, referring to FIG. 22, a semi-transmissive exposure process (for example, using a halftone mask or a slit mask) is performed. Hereinafter, descriptions will be provided by exemplifying a case in which a photosensitive organic film 108 is formed using a photosensitive layer including a positive photosensitive material. However, the inventive concepts are not limited thereto, and in other exemplary embodiments, the photosensitive organic film 108 may also be formed using a negative photosensitive layer including a positive photosensitive material. In this case, a region from which the photosensitive organic film 108 is to be removed by a halftone mask SUB or a slit mask, a region in which the photosensitive organic film 108 remains and thus an upper surface of the pixel definition layer 180_1 is to be formed, and a region in which the photosensitive organic film 108 is removed and thus the spacer SPC is to be formed are exposed to different extents That is, the halftone mask SUB or the slit mask includes a first light transmitting portion Ma configured to transmit 100% of light, a second light transmitting portion configured to transmit about half of light, and a third light transmitting portion Mc configured to barely transmit any light. Exposure is performed by disposing the halftone mask SUB or the slit such that the first light transmitting portion Ma corresponds to the region from which the photosensitive organic film 108 is to be removed, the second light transmitting portion Mb corresponds to the region in which approximately half of the photosensitive organic film 108 remains and thus the upper surface of the pixel definition layer 180_1 is to be formed, and the third light scattering portion Mc corresponds to the region in which the photosensitive organic film 108 remains and thus the spacer SPC is to be formed.

Then, the photosensitive organic film 108 is removed through development from a portion of which 100% is exposed by the first light transmitting portion Ma, and thus, a first electrode 171_1 below the photosensitive organic film 108 is exposed. In addition, the photosensitive organic film 108 remains intact at a portion at which 100% of light is blocked by the third light transmitting portion Mc, and thus, the portion takes a shape of the spacer SPC. About half of the photosensitive organic film 108 remains in a region of the second light transmitting portion Mb, through which about half of light passes, and thus, the upper surface of the pixel definition layer 180_1 is formed.

Figure 23:
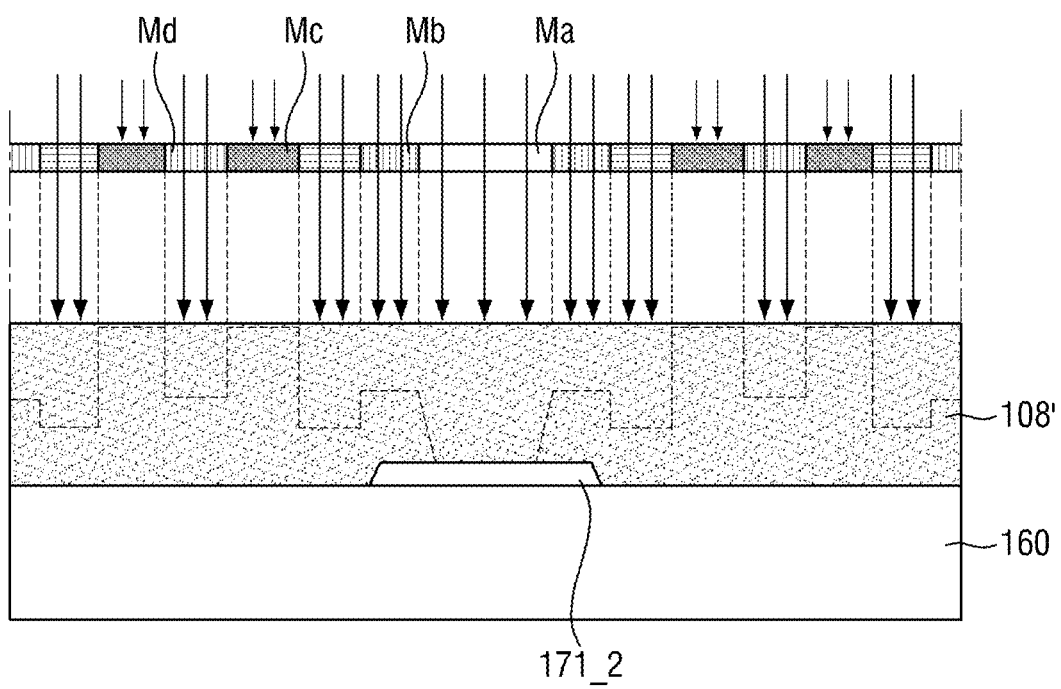
FIG. 23 is a view illustrating a process of manufacturing an organic light-emitting display device shown in FIG. 19.

FIG. 23 is a view illustrating a process of manufacturing an organic light-emitting display device shown in FIG. 19.

Referring to FIGS. 19 and 23, a configuration of FIGS. 19 and 23 is different from the configuration in which the pair of pits PIT are provided on the pixel definition layer 180 of FIGS. 7 and 21 and a configuration in which the pair of spacers SPC are provided on the pixel definition layer 180_1 of FIGS. 15 and 22 in that the pair of pits PIT_1 and the pair of spacers SPC_1 are provided on the pixel definition layer 180_2.

Specifically, referring to FIG. 23, a semi-transmissive exposure process (for example, using a halftone mask or a slit mask) is performed. Hereinafter, descriptions will be provided by exemplifying a case in which a photosensitive organic film 108 is formed using a photosensitive layer including a positive photosensitive material. However, the inventive concepts are not limited thereto, and in other exemplary embodiments, the photosensitive organic film 108 may also be formed using a negative photosensitive layer including a positive photosensitive material. In this case, a region from which the photosensitive organic film 108 is to be removed by a halftone mask SUB or a slit mask and a region in which the photosensitive organic film 108 remains and thus the pit and an upper surface of the pixel definition layer 180_2 are to be formed are exposed to different extents That is, the halftone mask SUB or the slit mask includes a first light transmitting portion Ma configured to transmit 100% of light, a second light transmitting portion configured to transmit about half of light, a third light transmitting portion Mc configured to barely transmit any light, and a fourth light transmitting portion Md configured to transmit light at a medium extent between a light transmission extent of the first light transmitting portion Ma and a light transmission extent of the second light transmitting portion Mb. Exposure is performed by disposing the halftone mask SUB or the slit such that the first light transmitting portion Ma corresponds to a region from which the photosensitive organic film 108 is to be removed, the second light transmitting portion Mb corresponds to a region in which approximately half of the photosensitive organic film 108 remains and thus the upper surface of the pixel definition layer 180_2 is to be formed, the third light scattering portion Mc corresponds to the region in which the photosensitive organic film 108 remains and thus the spacer SPC_1 is to be formed, and the fourth light transmitting portion Md corresponds to a region in which the photosensitive organic film 108 remains and thus the pit PIT_1 is to be formed.

Then, the photosensitive organic film 108 is removed through development from a portion of which 100% is exposed by the first light transmitting portion Ma, and thus, a first electrode 171_2 below the photosensitive organic film 108 is exposed. In addition, the photosensitive organic film 108 remains intact at a portion at which 100% of light is blocked by the third light transmitting portion Mc, and thus, the portion takes a shape of the spacer SPC_1. About half of the photosensitive organic film 108 remains in a region of the second light transmitting portion Mb, through which about half of light passes, and thus, the upper surface of the pixel definition layer 180_2 is formed. The photosensitive organic film 108 remains at a medium extent between the remaining photosensitive organic film 108 of the first transmitting portion Ma and the remaining photosensitive organic film 108 of the second transmitting portion Mb in a region of the fourth light transmitting portion Md configured to transmit light at the middle extent between the light transmission extent of the first light transmitting portion Ma and the light transmission extent of the second light transmitting portion Mb, and thus, the PIT_1 is formed.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate which comprises a plurality of pixels, each of the plurality of pixels comprises an emission portion and a non-emission portion;
   a first electrode which is disposed on the emission portion;
   a pixel definition layer which is disposed on an edge of the first electrode and the non-emission portion;
   a common organic layer which is disposed on the first electrode and the pixel definition layer;
   an organic light-emitting layer which is disposed on the common organic layer and overlaps the emission portion; and
   a second electrode which is disposed on the common organic layer and the organic light-emitting layer,
   wherein the pixel definition layer comprises a plurality of pits between adjacent pixels,
   wherein the plurality of pits are recessed from an upper surface of the pixel definition layer toward the substrate,
   wherein the common organic layer and the second electrode are separated by the plurality of pits,
   wherein the second electrode includes a first portion overlapping the plurality of pits and a second portion which does not overlap the plurality of pits, and
   wherein the first portion of the second electrode and the second portion of the second electrode are spaced apart from each other.

2. The display device of claim 1, wherein the common organic layer comprises a hole injection layer and a hole transporting layer.

3. The display device of claim 1, wherein each of the plurality of pits has a flat surface parallel to a top surface of the substrate and a side surface perpendicular to the top surface of the substrate.

4. The display device of claim 1, wherein the pixel has a diamond shape in which a first subpixel and a second subpixel are alternately disposed in an Y-axis direction and two third subpixels are disposed in an X-axis direction perpendicular to the Y-axis direction between the first subpixel and the second subpixel.

5. The display device of claim 4, wherein the first, second, and third subpixels have different sizes.

6. The display device of claim 5, wherein each of the plurality of pits is formed to be spaced a certain distance from each side of the first, second, and third subpixels.

7. The display device of claim 6, wherein a length of each of the plurality of pits is the same as a length of the side of each of the first, second, and third subpixels.

8. The display device of claim 6, wherein each of the plurality of pits is further formed to be spaced apart from each vertex of the first, second, and third subpixels.

9. The display device of claim 1, further comprising a thin film encapsulation layer disposed on the second electrode,
   wherein a touch sensor layer is disposed on the thin film encapsulation layer.

10. The display device of claim 9, wherein the touch sensor layer comprises sensing electrodes in a touch sensor region, and the sensing electrodes overlap at least a portion of the plurality of pits.

11. A display device comprising:
    a substrate which comprises a plurality of pixels, each of the plurality of pixels comprises an emission portion and a non-emission portion;
    a first electrode which is disposed on the emission portion;
    a pixel definition layer which is disposed on an edge of the first electrode and the non-emission portion;
    a common organic layer which is disposed on the first electrode and the pixel definition layer;

an organic light-emitting layer which is disposed on the common organic layer and overlaps the emission portion and a second electrode which is disposed on the common organic layer and the organic light-emitting layer, wherein the pixel definition layer comprises a plurality of pits between adjacent pixels, wherein the plurality of pits are recessed from an upper surface of the pixel definition layer toward the substrate, wherein the common organic layer and the second electrode are separated by the plurality of pits, wherein each of the plurality of pits has a flat surface parallel to a top surface of the substrate and a side surface perpendicular to the top surface of the substrate, and wherein thicknesses of the common organic layer and the second electrode disposed on the side surface of each of the plurality of pits are less than thicknesses of the common organic layer and the second electrode disposed on a top surface of the pixel definition layer.

12. A display device comprising:
a substrate which comprises a plurality of pixels, each of the plurality of pixels comprises an emission portion and a non-emission portion;
a first electrode which is disposed on the emission portion;
a pixel definition layer which is disposed on an edge of the first electrode and the non-emission portion;
a common organic layer which is disposed on the first electrode and the pixel definition layer;
an organic light-emitting layer which is disposed on the common organic layer and overlaps the emission portion;
a second electrode which is disposed on the common organic layer and the organic light-emitting layer;
a thin film encapsulation layer disposed on the second electrode; and
a touch sensor layer disposed on the thin film encapsulation layer,
wherein the pixel definition layer comprises a plurality of pits between adjacent pixels,
wherein the common organic layer and the second electrode are separated by the plurality of pits,
wherein the thin film encapsulation layer comprises a first inorganic film, an organic film, and a second inorganic film, and
wherein the first inorganic film is in direct contact with side surfaces of a separated portion of the common organic layer and a separated portion of the second electrode.

13. A display device comprising:
a substrate which comprises a plurality of pixels, each of the plurality of pixels comprises an emission portion and a non-emission portion;
a first electrode which is disposed on the emission portion;
a pixel definition layer which is disposed on an edge of the first electrode and the non-emission portion;
a common organic layer which is disposed on the first electrode and the pixel definition layer;
an organic light-emitting layer which is disposed on the common organic layer and overlaps the emission portion; and
a second electrode which is disposed on the common organic layer and the organic light-emitting layer, wherein the pixel definition layer comprises a plurality of spacers between adjacent pixels, wherein the common organic layer and the second electrode are separated by the plurality of spacers, wherein the second electrode includes a first portion overlapping the plurality of spacers and a second portion which does not overlap the plurality of spacers, and wherein the first portion of the second electrode and the second portion of the second electrode are spaced apart from each other.

14. The display device of claim 13, wherein the common organic layer comprises a hole injection layer and a hole transporting layer.

15. The display device of claim 13, wherein each of the plurality of spacers has a top surface parallel to a top surface of the substrate and a side surface perpendicular to the top surface of the substrate.

16. The display device of claim 13, wherein the pixels have a diamond shape in which a first subpixel and a second subpixel are alternately disposed in an Y-axis direction and two third subpixels are disposed in an X-axis direction perpendicular to the Y-axis direction between the first subpixel and the second subpixel.

17. The display device of claim 16, wherein the first, second, and third subpixels have different sizes.

18. The display device of claim 17, wherein each of the plurality of spacer is formed to be spaced a certain distance from each side of the first, second, and third subpixels.

19. The display device of claim 18, wherein a length of each of the plurality of spacers is the same as a length of the side of the first, second, and third subpixels.

20. A display device comprising:
a substrate which comprises a plurality of pixels, each of the plurality of pixels comprises an emission portion and a non-emission portion;
a first electrode which is disposed on the emission portion;
a pixel definition layer which is disposed on an edge of the first electrode and the non-emission portion;
a common organic layer which is disposed on the first electrode and the pixel definition layer;
an organic light-emitting layer which is disposed on the common organic layer and overlaps the emission portion and
a second electrode which is disposed on the common organic layer and the organic light-emitting layer,
wherein the pixel definition layer comprises a plurality of spacers between adjacent pixels,
wherein the common organic layer and the second electrode are separated by the plurality of spacers,
wherein each of the plurality of spacers has a top surface parallel to a top surface of the substrate and a side surface perpendicular to the top surface of the substrate, and
wherein thicknesses of the common organic layer and the second electrode disposed on the side surface of each of the plurality of spacer are less than those of the common organic layer and the second electrode disposed on a top surface of the pixel definition layer.

* * * * *